(12) United States Patent
Lee et al.

(10) Patent No.: US 10,128,245 B2
(45) Date of Patent: Nov. 13, 2018

(54) SEMICONDUCTOR DEVICES INCLUDING ACTIVE AREAS WITH INCREASED CONTACT AREA

(71) Applicant: Samsung Electronics Co., Ltd., Suwon-si, Gyeonggi-do (KR)

(72) Inventors: Do Sun Lee, Suwon-si (KR); Joon Gon Lee, Seoul (KR); Na Rae Kim, Seoul (KR); Chul Sung Kim, Seongnam-si (KR); Do Hyun Lee, Seoul (KR); Ryuji Tomita, Yongin-si (KR); Sang Jin Hyun, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/473,031

(22) Filed: Mar. 29, 2017

(65) Prior Publication Data

US 2018/0090495 A1    Mar. 29, 2018

(30) Foreign Application Priority Data

Sep. 23, 2016    (KR) .................. 10-2016-0122222

(51) Int. Cl.
| | |
|---|---|
| *H01L 29/78* | (2006.01) |
| *H01L 27/092* | (2006.01) |
| *H01L 29/165* | (2006.01) |
| *H01L 29/45* | (2006.01) |
| *H01L 29/417* | (2006.01) |
| *H01L 21/8238* | (2006.01) |
| *H01L 29/08* | (2006.01) |

(Continued)

(52) U.S. Cl.
CPC .... *H01L 27/0924* (2013.01); *H01L 21/02532* (2013.01); *H01L 21/28518* (2013.01); *H01L 21/823814* (2013.01); *H01L 21/823821* (2013.01); *H01L 21/823828* (2013.01); *H01L 21/823871* (2013.01); *H01L 21/823878* (2013.01); *H01L 29/0847* (2013.01); *H01L 29/165* (2013.01); *H01L 29/4175* (2013.01); *H01L 29/41791* (2013.01); *H01L 29/45* (2013.01); *H01L 29/66545* (2013.01); *H01L 29/7848* (2013.01); *H01L 29/7856* (2013.01)

(58) Field of Classification Search
CPC .................................................. H01L 29/7856
USPC ................................................................. 257/739
See application file for complete search history.

(56) References Cited

U.S. PATENT DOCUMENTS

| | | | |
|---|---|---|---|
| 8,420,464 B2 * | 4/2013 | Basker | ................ H01L 27/0924 257/E21.431 |
| 8,541,885 B2 | 9/2013 | Gerhardt et al. | |

(Continued)

*Primary Examiner* — Chandra Chaudhari
(74) *Attorney, Agent, or Firm* — Myers Bigel, P.A.

(57) ABSTRACT

Semiconductor devices may have a first semiconductor element including first active regions that are doped with a first conductivity-type impurity and that are on a semiconductor substrate, a first gate structure between the first active regions, and first contacts connected to the first active regions, respectively; and a second semiconductor element including second active regions that are doped with a second conductivity-type impurity different from the first conductivity-type impurity and that are on the semiconductor substrate, a second gate structure between the second active regions, and second contacts connected to the second active regions, respectively, and having a second length greater than a first length of each of the first contacts in a first direction parallel to an upper surface of the semiconductor substrate.

20 Claims, 26 Drawing Sheets

(51) Int. Cl.
*H01L 29/66* (2006.01)
*H01L 21/02* (2006.01)
*H01L 21/285* (2006.01)

(56) References Cited

U.S. PATENT DOCUMENTS

| | | |
|---|---|---|
| 9,331,080 B2 | 5/2016 | Eom et al. |
| 2015/0035023 A1 | 2/2015 | Kim et al. |
| 2015/0076607 A1 | 3/2015 | Alptekin et al. |
| 2015/0084134 A1 | 3/2015 | Lin et al. |
| 2016/0027918 A1 | 1/2016 | Kim et al. |
| 2016/0071848 A1 | 3/2016 | Sengupta et al. |
| 2016/0087053 A1 | 3/2016 | Kim et al. |
| 2016/0104787 A1* | 4/2016 | Kittl .................. H01L 29/665 438/283 |
| 2016/0172493 A1 | 6/2016 | Koh et al. |
| 2016/0308004 A1 | 10/2016 | Lee et al. |

\* cited by examiner

SEMICONDUCTOR DEVICES INCLUDING ACTIVE AREAS WITH INCREASED CONTACT AREA

CROSS-REFERENCE TO RELATED APPLICATION

This U.S. non-provisional patent application claims benefit of priority under 35 U.S.C. § 119 to Korean Patent Application No. 10-2016-0122222, filed on Sep. 23, 2016, in the Korean Intellectual Property Office, the entire contents of which are incorporated herein by reference.

BACKGROUND

1. Field

The present inventive concepts relate to semiconductor devices.

2. Description of Related Art

Semiconductor devices are an important part of the electronics industry. Storage devices storing data, processors operationally processing data, and the like may be implemented by semiconductor devices. Research has been carried out into increasing the degree of integration of devices and lowering power consumption in semiconductor devices. In order to overcome limitations due to reductions in the size of semiconductor elements included in semiconductor devices, research is being undertaken into the development of a three-dimensional semiconductor device.

SUMMARY

Aspects of the present inventive concepts provide semiconductor devices having improved electrical characteristics.

According to aspects of the present inventive concepts, a semiconductor device includes a first semiconductor element including first active regions that are doped with a first conductivity-type impurity and that are on a semiconductor substrate, a first gate structure between the first active regions, and first contacts connected to the first active regions, respectively; and a second semiconductor element including second active regions that are doped with a second conductivity-type impurity different from the first conductivity-type impurity and that is on the semiconductor substrate, a second gate structure between the second active regions, and second contacts connected to the second active regions, respectively, and having a second length greater than a first length of each of the first contacts in a first direction parallel to an upper surface of the semiconductor substrate.

According to aspects of the present inventive concepts, a semiconductor device includes a plurality of fin structures that are on a semiconductor substrate, first active regions that are on the plurality of fin structures and doped with a first conductivity-type impurity, second active regions that are on the plurality of fin structures and doped with a second conductivity-type impurity having a conductivity type different from the first conductivity-type impurity, a first silicide layer that is on surfaces of the first active regions, and a second silicide layer that is on surfaces of the second active regions and having a second area less than a first area of the first silicide layer.

According to aspects of the present inventive concepts, a semiconductor device includes a semiconductor substrate, a plurality of fin structures that extend in a first direction on the semiconductor substrate, a first gate structure that extends in a second direction, crossing the first direction, on the plurality of fin structures, a second gate structure that extends in the second direction on the plurality of fin structures, a first active region of a first conductivity type that is on a fin structure of the plurality of fin structures and that is adjacent the first gate structure, a second active region of a second conductivity type, different from the first conductivity type, that is on the fin structure of the plurality of fin structures and that is adjacent the second gate structure, a first contact on the first active region, a silicide layer on a portion of an upper surface of the first active region that is not between the first contact and the first active region, and a second contact on the second active region, the second contact having a second length in the second direction that is greater than a first length of the first contact in the second direction.

BRIEF DESCRIPTION OF DRAWINGS

The above and other aspects, features and other advantages of the present inventive concepts will be more clearly understood from the following detailed description when taken in conjunction with the accompanying drawings, in which.

DETAILED DESCRIPTION

Hereinafter, embodiments of the present inventive concepts will be described with reference to the accompanying drawings.

Figure 1:
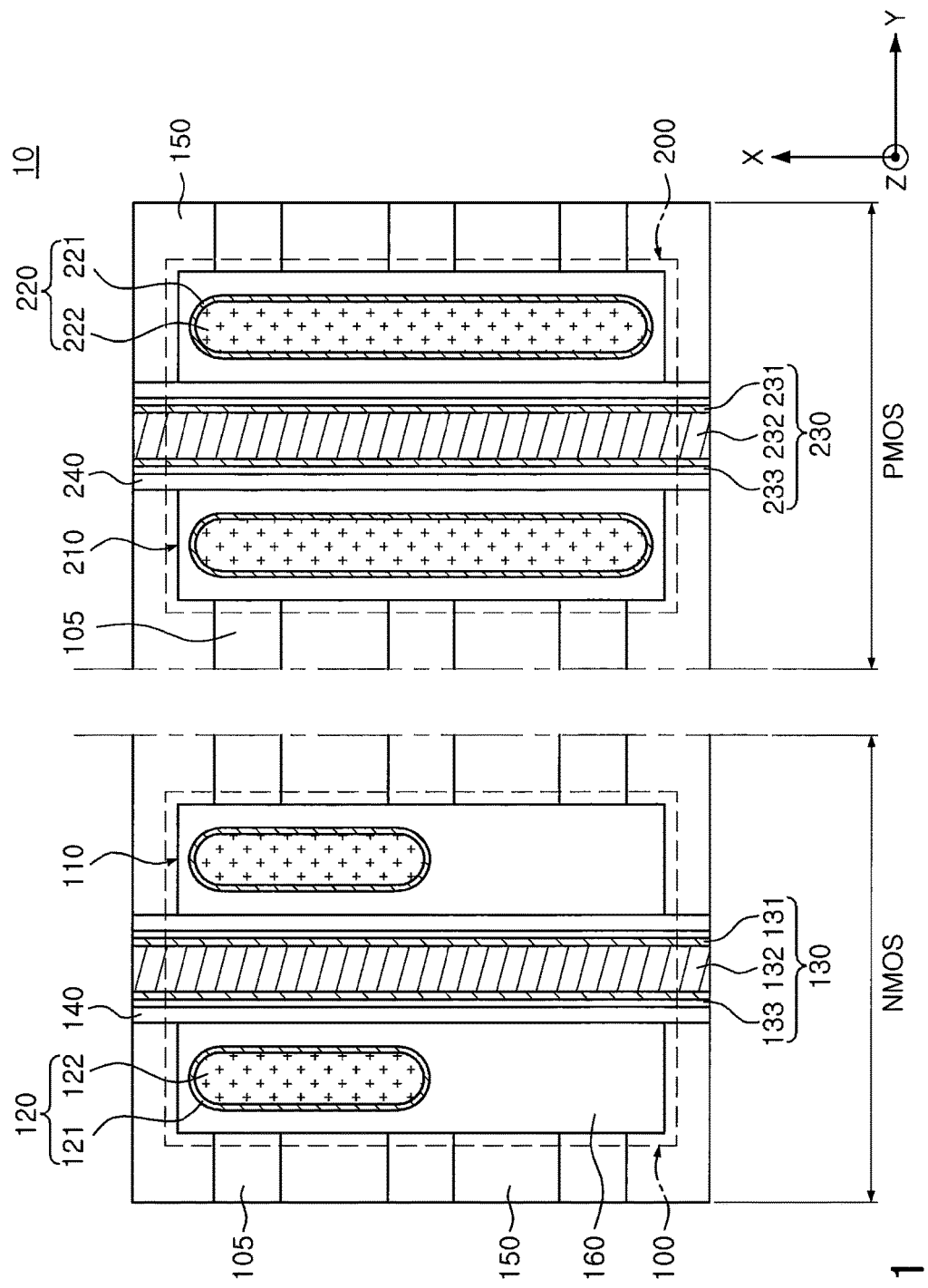
FIG. 1 is a plan view of a semiconductor device according to example embodiments of the present inventive concepts.

FIG. 1 is a plan view of a semiconductor device according to example embodiments of the present inventive concepts.

With reference to FIG. 1, a semiconductor device 10 according to example embodiments of the present inventive concepts may include an NMOS region and a PMOS region. A first semiconductor element 100 and a second semiconductor element 200 may be disposed in the NMOS region and the PMOS region, respectively. For example, the first semiconductor element 100 may be an NMOS transistor, and the second semiconductor element 200 may be a PMOS transistor.

The first semiconductor element 100 may include first active regions 110 provided on a plurality of fin structures 105 to provide a source region and a drain region, first contacts 120 connected to the first active regions 110, and a first gate structure 130 disposed between the first active regions 110 while extending to intersect the plurality of fin structures 105. The first active regions 110 may be formed of silicon (Si) and may be doped with an N-type impurity such as phosphorus (P), nitrogen (N), arsenic (As), and/or antimony (Sb).

The second semiconductor element 200 may include second active regions 210 provided on a plurality of fin structures 105 to provide a source region and a drain region, second contacts 220 connected to the second active regions 210, and a second gate structure 230 disposed between the second active regions 210 while extending to intersect the plurality of fin structures 105. At least a portion of the plurality of fin structures 105 may be formed over the NMOS and PMOS regions and may be shared by the first and second semiconductor elements 100 and 200.

The second active regions 210 may be formed of silicon-germanium (SiGe), and may be doped with a p-type impurity such as, but not limited to, boron (B), indium (In), gallium (Ga), and/or boron trifluoride ($BF_3$). The first active regions 110 and the second active regions 210 may include different materials, and may be doped with different conductivity-type impurities.

The first and second gate structures 130 and 230 may extend in a first direction (an X-axis direction in FIG. 1) to intersect the plurality of fin structures 105 extending in a second direction (e.g., a Y-axis direction) intersecting the first direction. An element isolation film 150 may be formed between the plurality of fin structures 105. The element isolation film 150 may include an insulating material, such as, but not limited to, silicon oxide, silicon nitride, and/or silicon oxynitride.

The first and second contacts 120 and 220 may include first metal layers 121 and 221 and second metal layers 122 and 222, respectively. The first metal layers 121 and 221 may serve as diffusion prevention layers, and the second metal layers 122 and 222 may be formed to be surrounded by the first metal layers 121 and 221, respectively. The first contacts 120 may have a length shorter than that of the second contacts 220 in the first direction (e.g., the X-axis direction). For example, in the case in which the first contacts 120 are formed to have a length shorter than that of the second contacts 220, areas of contact between the first contacts 120 and the first active regions 110 may be smaller, and thus a resistance component may be increased. In example embodiments of the present inventive concepts, by forming a first silicide layer 160 on the entirety of upper surfaces of the first active regions 110, a problem as described above may be reduced or prevented. In addition, as the first contacts 120 are formed to have a relatively short length in the first direction, parasitic capacitance generated between the first contacts 120 and the first gate structure 130 may be reduced.

First and second gate spacers 140 and 240 may be formed on side surfaces of the first and second gate structures 130 and 230, respectively. The first and second gate structures 130 and 230 may include first gate metal layers 131 and 231, second gate metal layers 132 and 232, and gate insulating layers 133 and 233, respectively.

Figure 2:
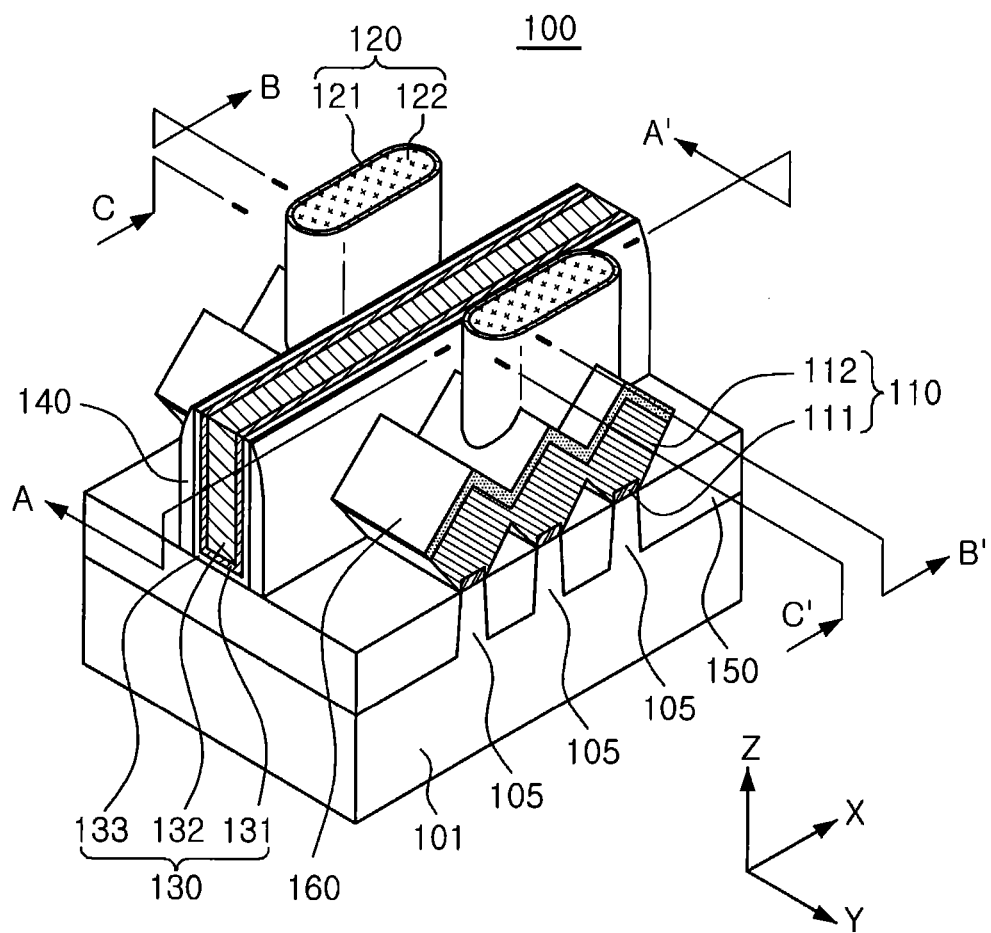
FIG. 2 is a perspective view of a first semiconductor element included in semiconductor devices according to example embodiments of the present inventive concepts.
Figure 3:
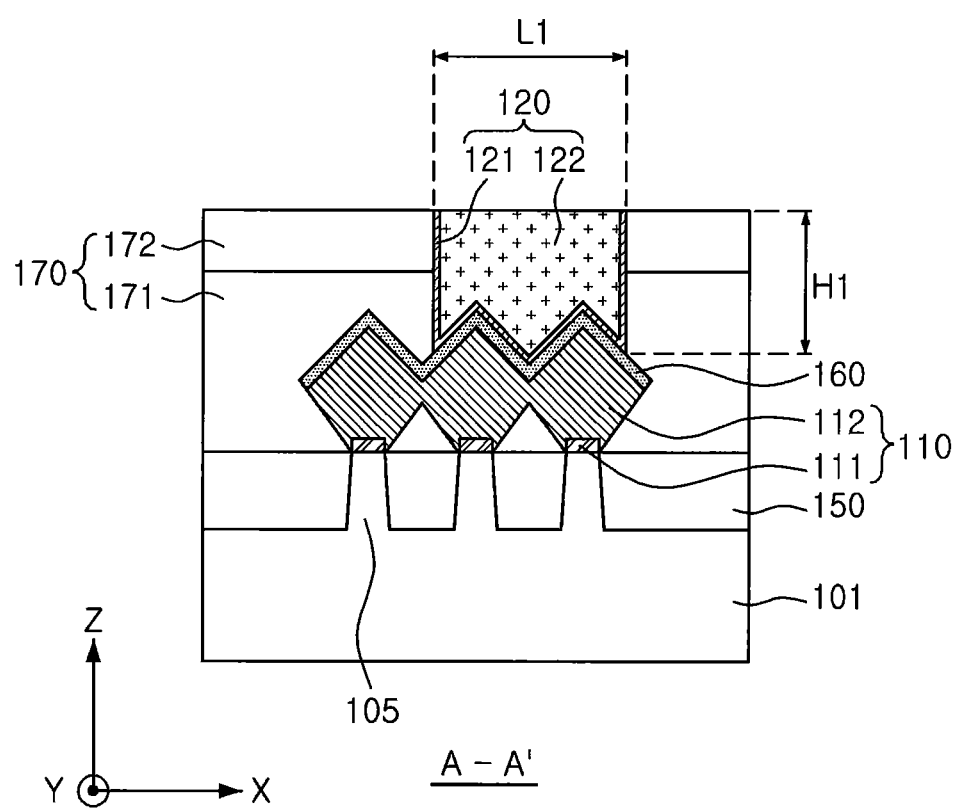
FIG. 3 is a cross-sectional view of the first semiconductor element illustrated in FIG. 2, taken along line A-A.
Figure 4:
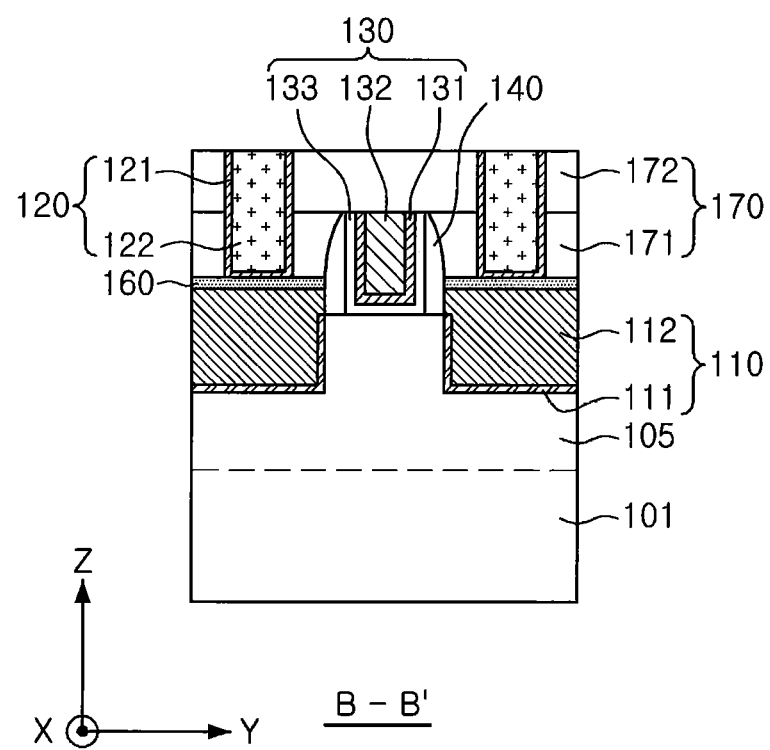
FIG. 4 is a cross-sectional view of the first semiconductor element illustrated in FIG. 2, taken along line B-B'.
Figure 5:
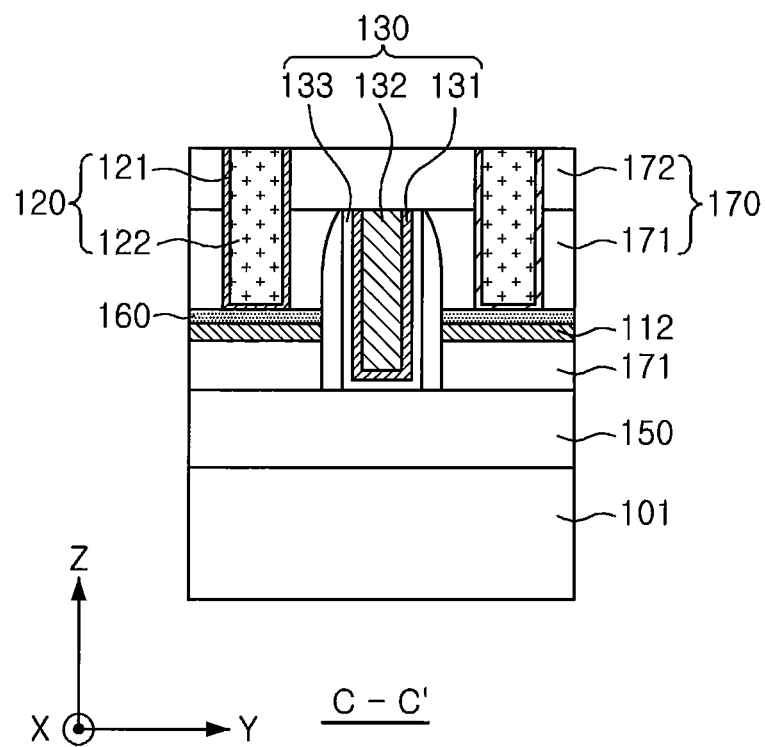
FIG. 5 is a cross-sectional view of the first semiconductor element illustrated in FIG. 2, taken along line C-C.

FIG. 2 is a perspective view of the first semiconductor element 100 included in semiconductor devices according to example embodiments of the present inventive concepts, while FIGS. 3 to 5 are cross-sectional views of the first semiconductor element 100 illustrated in FIG. 2, taken along lines A-A', B-B', and C-C', respectively. Hereinafter, the first semiconductor element 100 will be described with reference to FIGS. 2 to 5. In example embodiments of the present inventive concepts, the first semiconductor element 100 may be an NMOS transistor. For convenience of explanation, only principal components are illustrated in FIG. 2, and, for example, an interlayer insulating layer 170 of FIGS. 3 to 5 is omitted therefrom.

Referring to FIG. 2, the first semiconductor element 100 may include the first gate structure 130 extending in the first direction (X-axis direction) and the plurality of fin structures 105 extending in the second direction (Y-axis direction) to intersect the first gate structure 130. The plurality of fin structures 105 may be formed to protrude from an upper surface of a semiconductor substrate 101, and the element isolation film 150, including an insulating material, may be provided between the plurality of fin structures 105.

The first gate structure 130 may include the first and second gate metal layers 131 and 132 and the gate insulating layer 133. The gate insulating layer 133 may be disposed between the plurality of fin structures 105 and the first and second gate metal layers 131 and 132. The first gate spacer 140, formed of an insulating material, may be disposed on a side surface of the first gate structure 130, and the first active regions 110 may be formed adjacent the first gate spacer 140.

The first active regions 110 may provide a source region and/or a drain region of the first semiconductor element 100, and may have an elevated source/drain form in which upper surfaces of the first active regions 110 are disposed to be higher than a lower surface of the gate structure 130. In example embodiments of FIGS. 2 to 5, although the first active regions 110 are illustrated as having a pentagonal shape, the first active regions 110 may have various shapes. For example, the first active regions 110 may have one of polygonal, circular, and rectangular shapes, though the present inventive concepts are not limited thereto. The first active regions 110 on a plurality (e.g. three) of the fin structures 105 may have a structure connected to or merged with each other. The number of fin structures 105 connected to each other via a merged first active region 110 may be changed.

When the first semiconductor element 100 is an NMOS transistor, the fin structures 105 and the first active regions 110 may include silicon (Si). The first active regions 110 may include first regions 111 and a second region 112. The first regions 111 may be provided as regions growing from the fin structures 105, and the second region 112 may be a region growing from the first regions 111. The first regions 111 and the second region 112 may be doped with an N-type impurity. The first and second regions 111 and 112 may have different doping concentrations according to example embodiments.

The first silicide layer 160 may be formed on the first active regions 110. The first silicide layer 160 may be a layer formed by a reaction of titanium (Ti), cobalt (Co), nickel (Ni), tungsten (W), copper (Cu), tantalum (Ta), platinum (Pt), hafnium (Hf), molybdenum (Mo), radium (Ra) or an alloy thereof, with silicon (Si). The first silicide layer 160 may be formed on a portion of a surface of the first active regions 110 and may also be formed on the entirety of upper surfaces of the first active regions 110. Since a voltage applied to the first contacts 120 is supplied to the first active regions 110 through the first silicide layer 160, an effect of increasing a contact area may be obtained. In some embodiments, the first silicide layer 160 described above with reference to FIGS. 2 to 5 may be formed by a physical vapor deposition (PVD) process. In some embodiments, the first silicide layer 160 may be formed to have a greater thickness in portions of the first silicide layer 160 between the first contacts 120 and the first active regions 110.

As the first silicide layer 160 formed on the upper surfaces of the first active regions 110 may have an increased contact area, the first contacts 120 may be formed to have a relatively short length. Referring to FIG. 3, the first contacts 120 may have a length L1 in the first direction (X-axis direction), and the length L1 of each of the first contacts 120 may be less than a length of each of the second contacts 220, to be described herein, in the first direction. Thus, parasitic capacitance generated between the first contacts 120 and the first gate structure 130 may be reduced.

In some embodiments, an interlayer insulating layer 170 may be formed on the substrate 101. The interlayer insulating layer 170 may include a first interlayer insulating layer 171 and a second interlayer insulating layer 172 on the first interlayer insulating layer 171. The first silicide layer 160 may serve as an etch stop layer in an etching process of removing a portion of the interlayer insulating layer 170 to form the first contacts 120. Thus, the first active regions 110 may not be removed together with the interlayer insulating layer 170 at the time of removal thereof, and lower surfaces of the first contacts 120 may have a wave shape, corresponding to the upper surface of the first active regions 110. Though a wave shape of the upper surface of the first active regions 110 is illustrated, the present inventive concepts are not limited thereto.

In addition, since the first active regions 110 are not removed together with the interlayer insulating layer 170 in the etching process of removing a portion of the interlayer insulating layer 170 to form the first contacts 120, the first contacts 120 may be relatively thin. A height H1 of each of the first contacts 120, illustrated in FIG. 3, may be less than a height of each of the second contacts 220, to be described herein. As used herein, the height H1 of each of the first contacts 120 may refer to a height in a third direction (e.g., the Z-axis) that is perpendicular to the substrate 101.

The first contacts 120 may respectively include the first metal layer 121 and the second metal layer 122. The first metal layer 121 may serve as a diffusion prevention layer, and may include titanium nitride (TiN), tantalum nitride (TaN), and/or tungsten nitride (WN), in example embodiments. The first metal layer 121 may be formed along a sidewall of the interlayer insulating layer 170 and an upper surface of the first silicide layer 160. The second metal layer 122 may include a metal, such as tungsten (W), aluminum (Al), and/or molybdenum (Mo), and may be formed to fill an internal space of the first metal layer 121.

Figure 6:
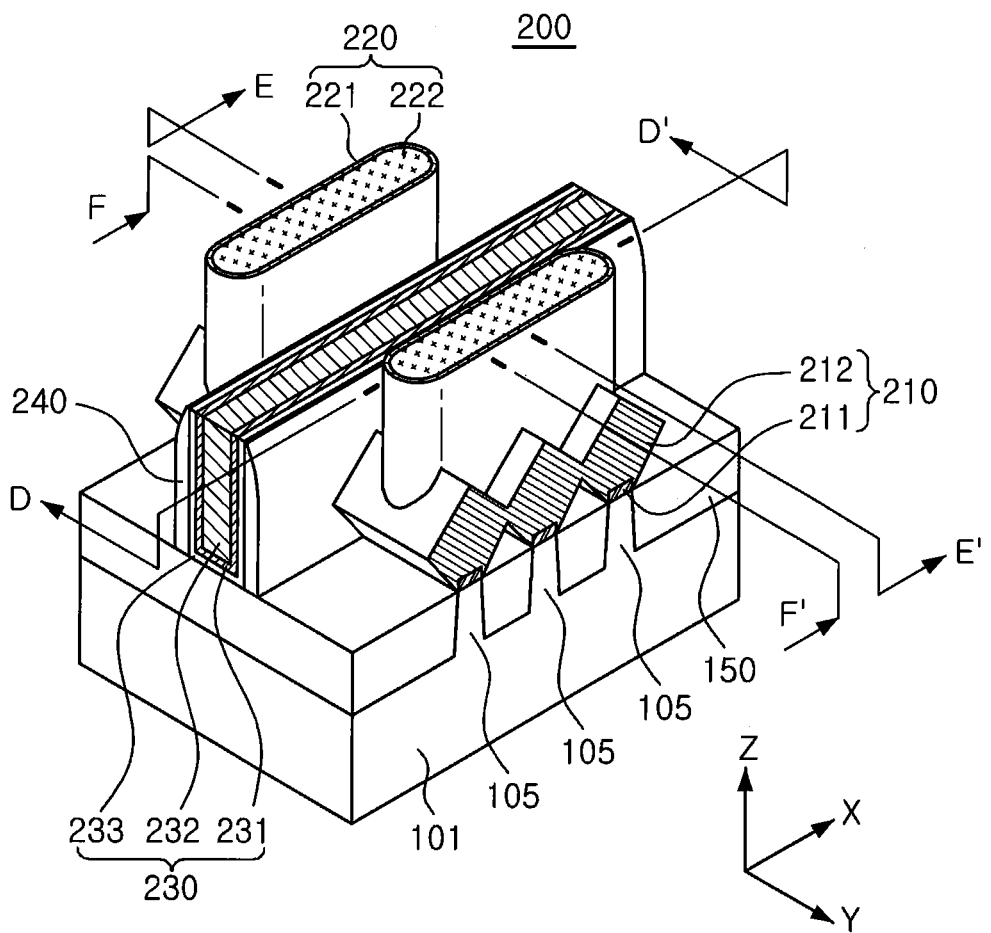
FIG. 6 is a perspective view of a second semiconductor element included in semiconductor devices according to example embodiments of the present inventive concepts.
Figure 7:
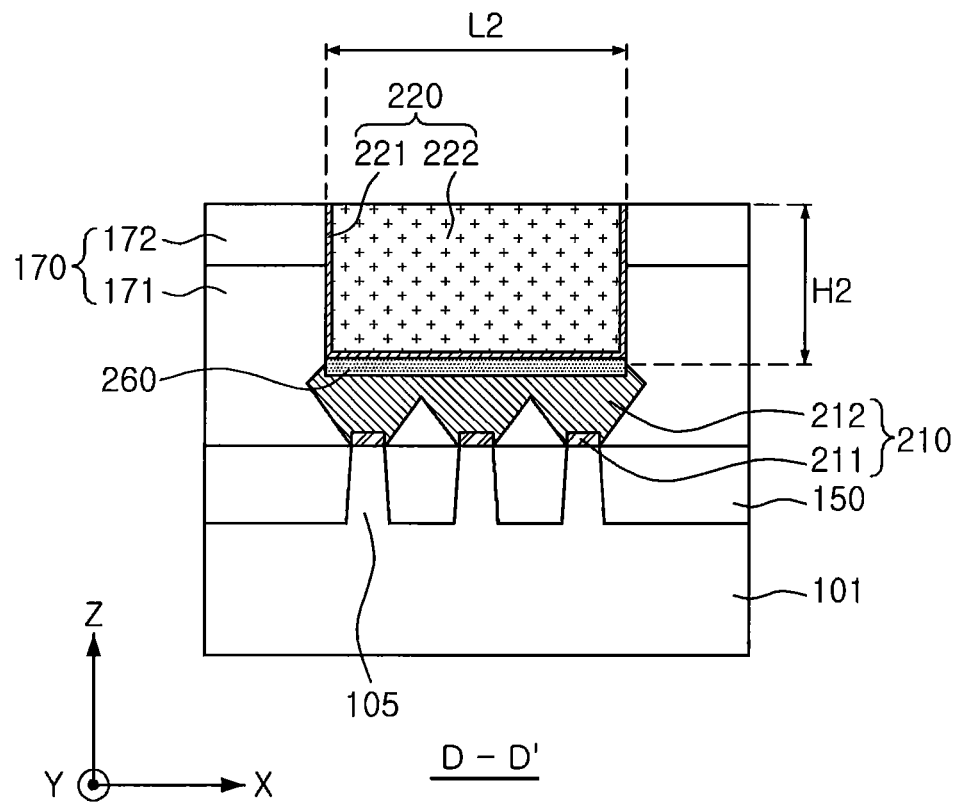
FIG. 7 is a cross-sectional view of the second semiconductor element illustrated in FIG. 6, taken along line D-D'.
Figure 8:
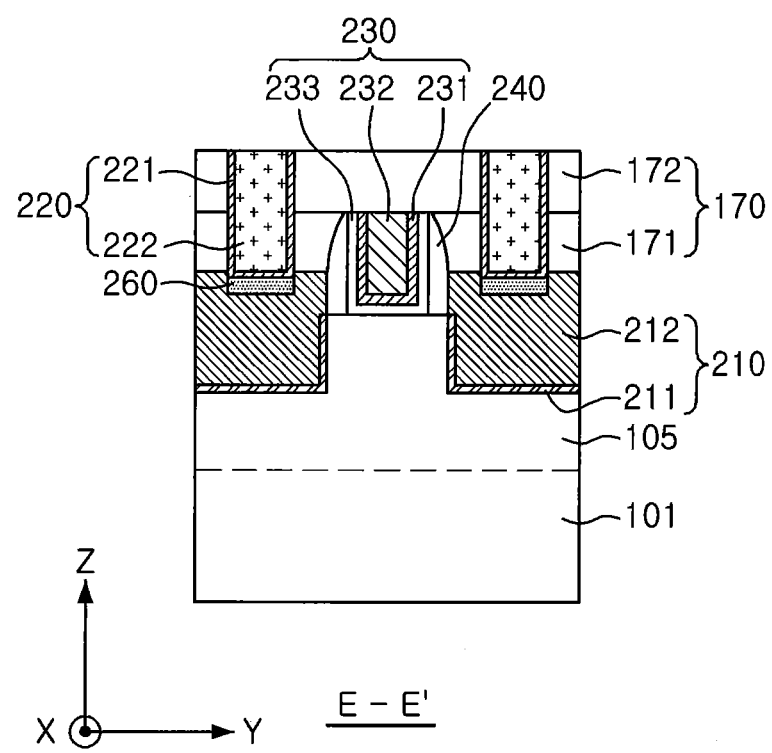
FIG. 8 is a cross-sectional view of the second semiconductor element illustrated in FIG. 6, taken along line E-E.
Figure 9:
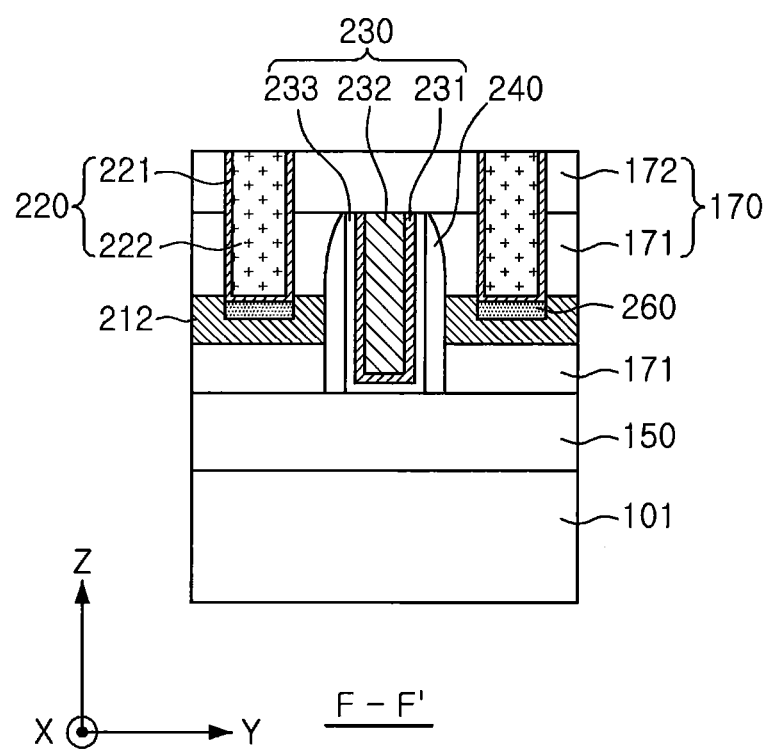
FIG. 9 is a cross-sectional view of the second semiconductor element illustrated in FIG. 6, taken along line F-F'.

FIG. 6 is a perspective view of the second semiconductor element 200 included in semiconductor devices according to example embodiments of the present inventive concepts. FIGS. 7 to 9 are cross-sectional views of the second semiconductor element 200 illustrated in FIG. 6, taken along respective lines D-D', E-E', and F-F. Hereinafter, the second semiconductor element 200 will be described with reference to FIGS. 6 to 9. In some example embodiments, the second semiconductor element 200 may be a PMOS transistor. In FIG. 6, only principal components are illustrated, and, for example, an interlayer insulating layer 170 of FIGS. 7 to 9 is omitted therefrom. The interlayer insulating layer 170 of FIGS. 7 to 9 may be similar to the interlayer insulator layer 170 described herein with respect to FIGS. 3 to 5, and may be formed similarly. For example, the interlayer insulating layer 170 may include a first interlayer insulating layer 171 and a second interlayer insulating layer 172 on the first interlayer insulating layer 171.

Referring to FIG. 6, the second semiconductor element 200 may include the second gate structure 230 extending in the first direction (X-axis direction) and the plurality of fin structures 105 extending in the second direction (Y-axis direction) to intersect the second gate structure 230. At least a portion of the plurality of fin structures 105 may be shared by the first semiconductor element 100 and the second semiconductor element 200.

The second gate structure 230 may have a structure similar to that of the first gate structure 130, and may include first and second gate metal layers 231 and 232 and the gate insulating layer 233. The second gate spacer 240 may be disposed on a side surface of the second gate structure 230, and the second active regions 210 may be provided adjacent the second gate spacer 240.

The second active regions 210 may provide a source region and/or a drain region of the second semiconductor element 200, and may have a structure similar to that of the first active regions 110, while the second active regions 210 may include a material different from that of the first active regions 110. In some embodiments, first regions 211 and a second region 212 included in the second active regions 210 may include silicon-germanium (SiGe) and may be doped with a p-type impurity. The p-type impurity concentrations of the first and second regions 211 and 212 may be different from each other.

The second contact 220, connected to the second active regions 210, may include the first and second metal layers 221 and 222. The first and second metal layers 221 and 222 included in the second contact 220 may include a material similar to that of the first and second metal layers 121 and 122 included in the first contact 120. A height H2 the second contact 220, illustrated in FIG. 7, may be greater than a height H1 of each of the first contacts 120 (see FIG. 3).

A second silicide layer 260 may be formed between the second contact 220 and the second active regions 210. With reference to FIGS. 7 to 9, the second silicide layer 260 may be formed to have an area corresponding to a lower surface of the second contact 220 in a manner different from that of the first silicide layer 160. In some embodiments, the lower surface of the second contact 220 may be substantially planar, in contrast to the non-planar shape of the lower surface of the first contact 120 illustrated in FIG. 3. Thus, an area of the second silicide layer 260 may be less than that of the first silicide layer 160.

In addition, the second contact 220 may have a length L2 longer than that of the length L1 (see FIG. 3) of the first contact 120 in the first direction (the X-axis direction). The structural difference between the first and second contacts 120 and 220 and the difference in areas between the first and second silicide layers 160 and 260, as described above, may be generated by a physical difference between the first and second active regions 110 and 210, which may be considered in a manufacturing process. In some embodiments, the silicon-germanium included in the second active regions 210 may have thermal stability lower than that of silicon included in the first active regions 110. The structural difference between the first and second contacts 120 and 220 and the difference in areas between the first and second silicide layers 160 and 260 may be characteristics provided by considering thermal stability of the second active regions 210 to prevent occurrence of defects occurring in a manufacturing process, which will be described herein.

Figure 10:
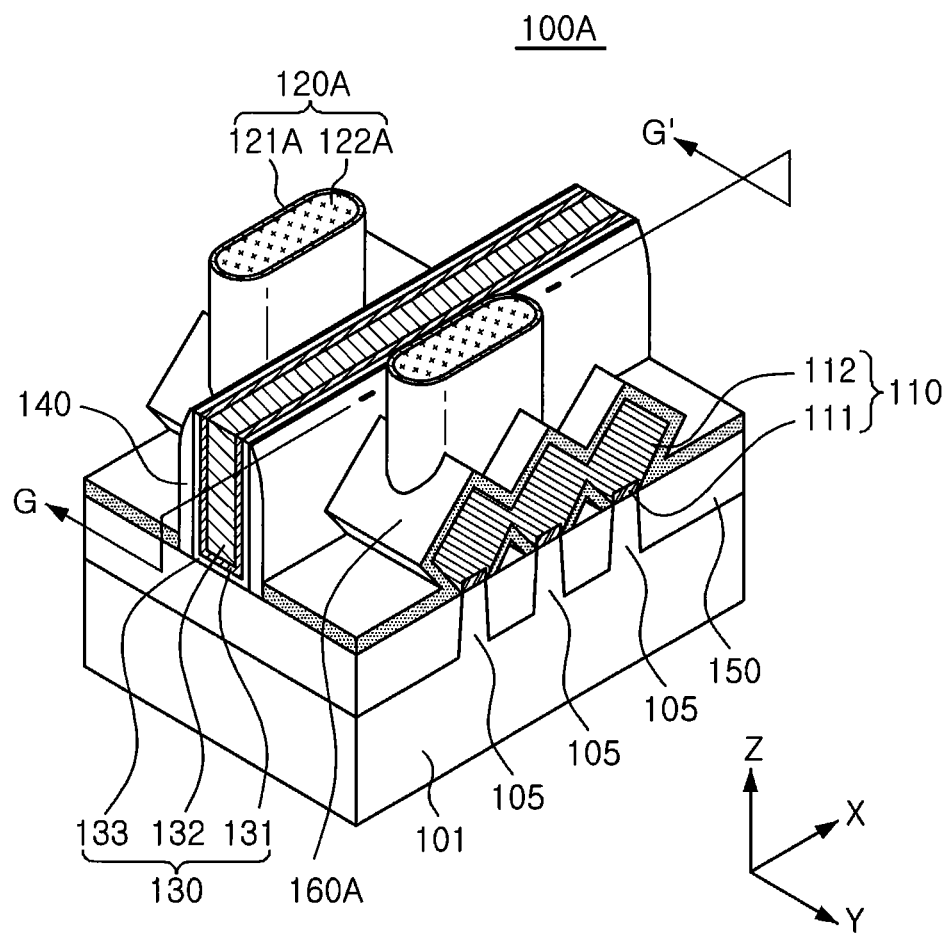
FIG. 10 is a perspective view of a first semiconductor element included in semiconductor devices according to example embodiments of the present inventive concepts.
Figure 11:
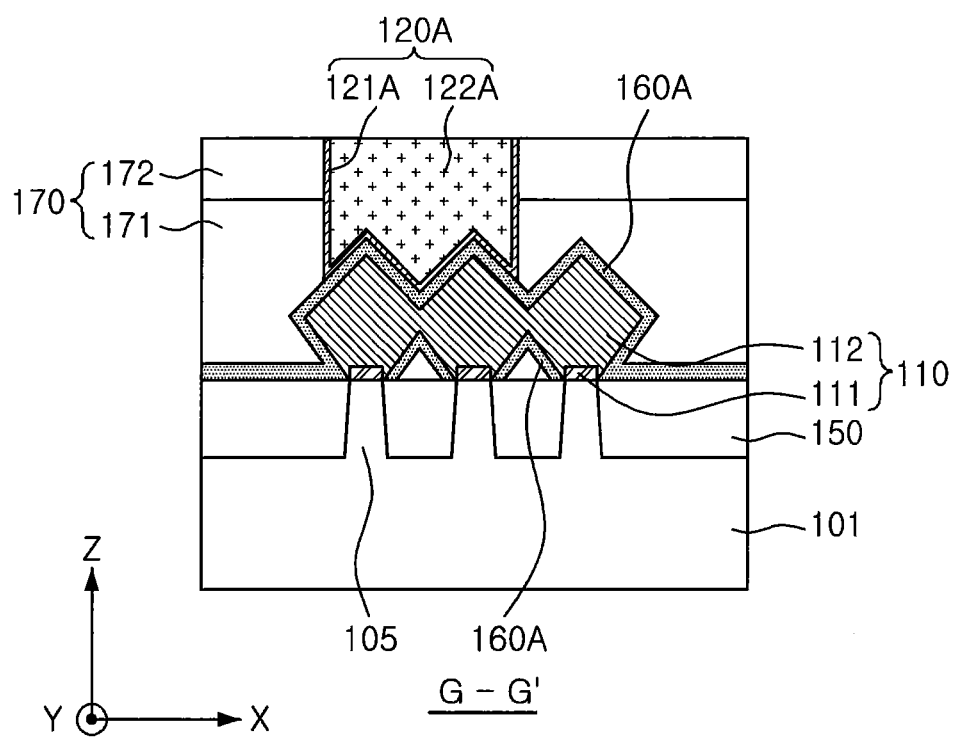
FIG. 11 is a cross-sectional view of the first semiconductor element illustrated in FIG. 10, taken along line G-G'.

FIG. 10 is a perspective view of a first semiconductor element 100A included in semiconductor devices according to example embodiments of the present inventive concepts, while FIG. 11 is a cross-sectional view of the first semiconductor element 100A illustrated in FIG. 10, taken along line G-G'. The first semiconductor element 100A according to example embodiments of the present inventive concepts illustrated in FIGS. 10 and 11 may have a structure different from that of the first semiconductor element 100 according to the example embodiments of FIGS. 2 to 5. For brevity, the description of FIGS. 10 and 11 will focus on differences with respect to FIGS. 2 to 5.

Referring to FIGS. 10 and 11, a first silicide layer 160A may be formed on the entirety of surfaces of first active regions 110. The first silicide layer 160A may be formed on an upper surface and a lower surface of the first active regions 110, and at least a portion of the first silicide layer 160A may be formed on an upper surface of the element isolation film 150. In some embodiments, the first silicide layer 160A may be formed by a chemical vapor deposition (CVD) process.

A position of a first contact 120A in the first semiconductor element 100A according to the example embodiment with reference to FIGS. 10 and 11 may be different from the position of the first contact 120 in the first semiconductor element 100 according to the example embodiments described above with reference to FIGS. 2 to 5. The positions of the first contacts 120 and 120A are not limited to those illustrated in the example embodiments of FIGS. 2 to 5, or the example embodiment of FIGS. 10 and 11, but may be variously changed within a range of positions in which the first contacts 120 and 120A contact the first silicide layers 160 and 160A, respectively.

FIGS. 12 to 25 are drawings illustrating methods of manufacturing semiconductor devices according to example embodiments of the present inventive concepts.

Figure 12:
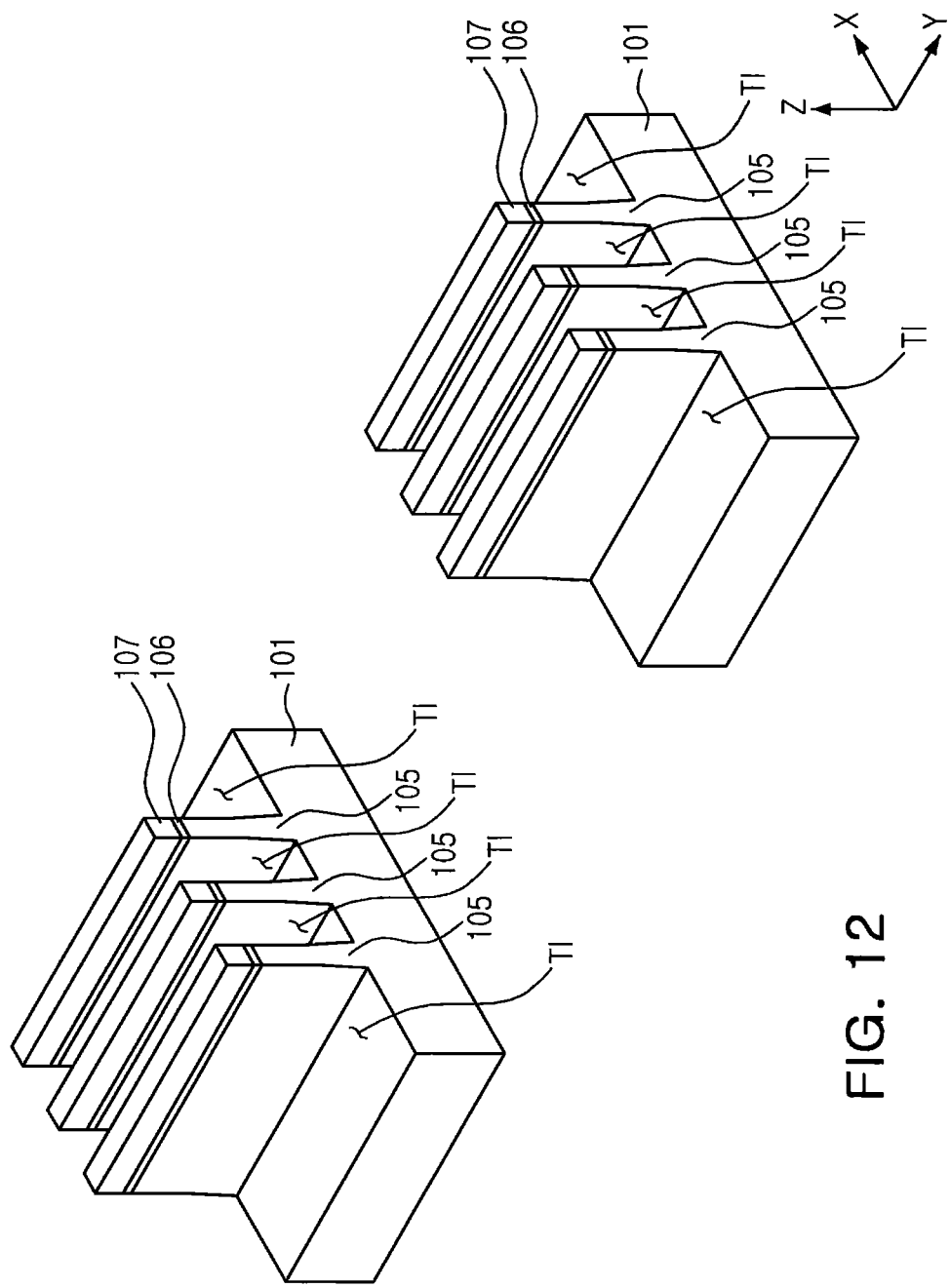
FIGS. 12 to 25 are drawings illustrating methods of manufacturing semiconductor devices according to example embodiments of the present inventive concepts.

Referring to FIG. 12, a semiconductor substrate 101 may be patterned to form trenches TI defining a plurality of fin structures 105. The plurality of fin structures 105 may be provided for formation of an active region of a semiconductor element. The plurality of fin structures 105 may be formed to extend continuously in an NMOS region and a PMOS region.

In order to form the plurality of fin structures 105 and the trenches TI, a pad oxide pattern 106 and a mask pattern 107 may be formed on the semiconductor substrate 101. The pad oxide pattern 106 may be a layer provided to protect the plurality of fin structures 105 and may be omitted according to some example embodiments. The mask pattern 107 may be a mask layer for patterning of the semiconductor substrate 101, and may include, silicon nitride and/or a carbon-containing material, though the present inventive concepts are not limited thereto. The mask pattern 107 may also include a plurality of layers.

The semiconductor substrate 101 may be anisotropically etched using the pad oxide pattern 106 and the mask pattern 107, to thus form the trenches TI. For example, when the trenches TI have a relatively high aspect ratio, a width of each of the trenches TI may be reduced toward a lower portion thereof. In this case, the plurality of respective fin structures 105 may have a form in which a width thereof is reduced toward an upper portion thereof.

Figure 13:
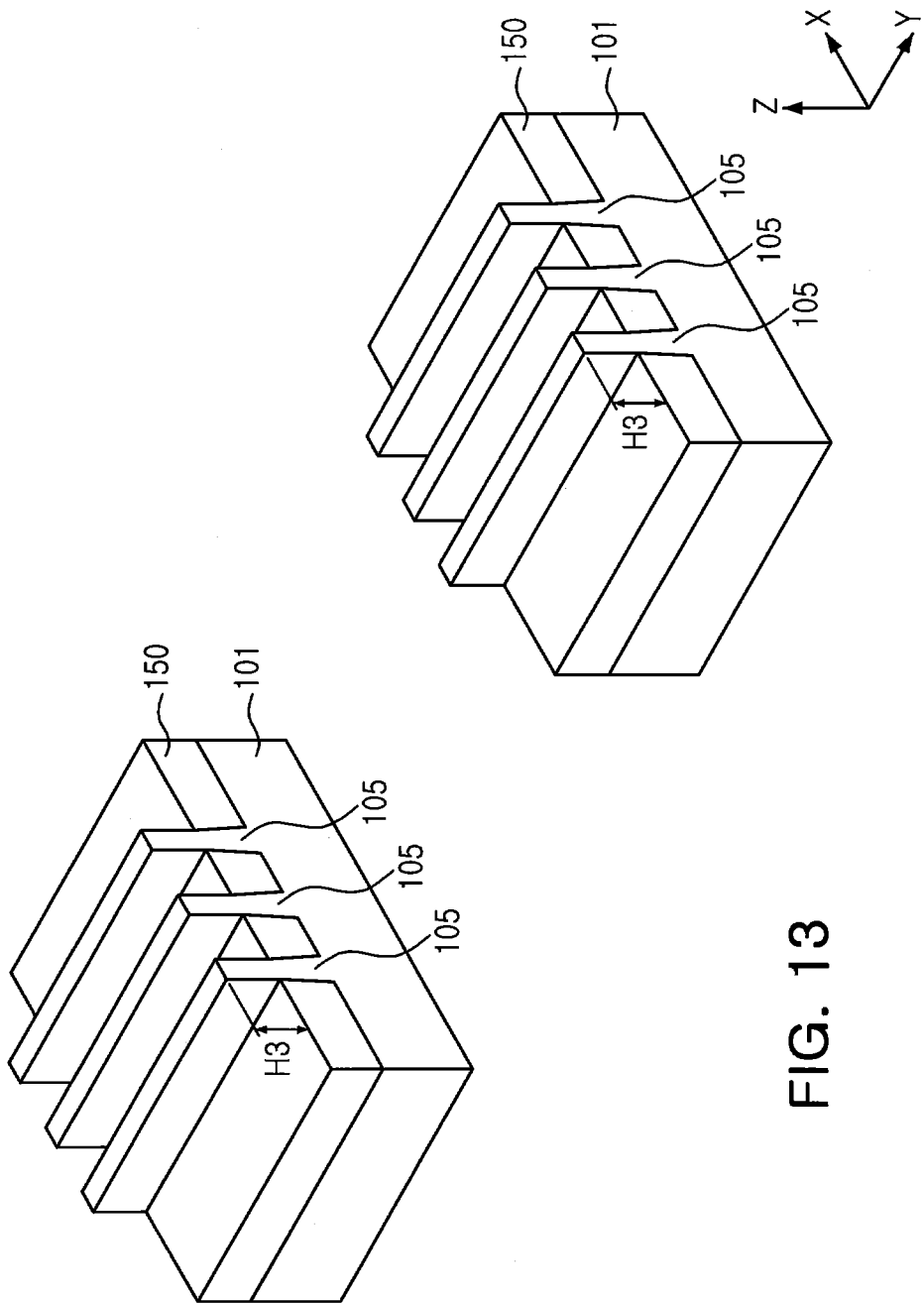

Next, referring to FIG. 13, an element isolation film 150 filling at least portions of the trenches TI may be formed. In order to form the element isolation film 150, a process of filling the trenches TI with an insulating material and then planarizing the insulating material may first be performed. During the planarization process, at least a portion of the pad oxide pattern 106 and the mask pattern 107 may be removed, together with the insulating material.

After the planarization process, the insulating material filling the trenches TI may be partially removed to allow the plurality of fin structures 105 to be externally exposed, thereby forming the element isolation film 150. The process of removing the insulating material may include a wet etching process in which the pad oxide pattern 106 is used as a mask. By partially removing the insulating material, the plurality of fin structures 105 may protrude by a height H3 from the element isolation film 150 as illustrated in FIG. 13. The pad oxide pattern 106 and the mask pattern 107 remaining on the plurality of fin structures 105 may be removed. The pad oxide pattern 106 may be removed together with the insulating material in the wet etching process to expose the plurality of fin structures 105.

Figure 14:
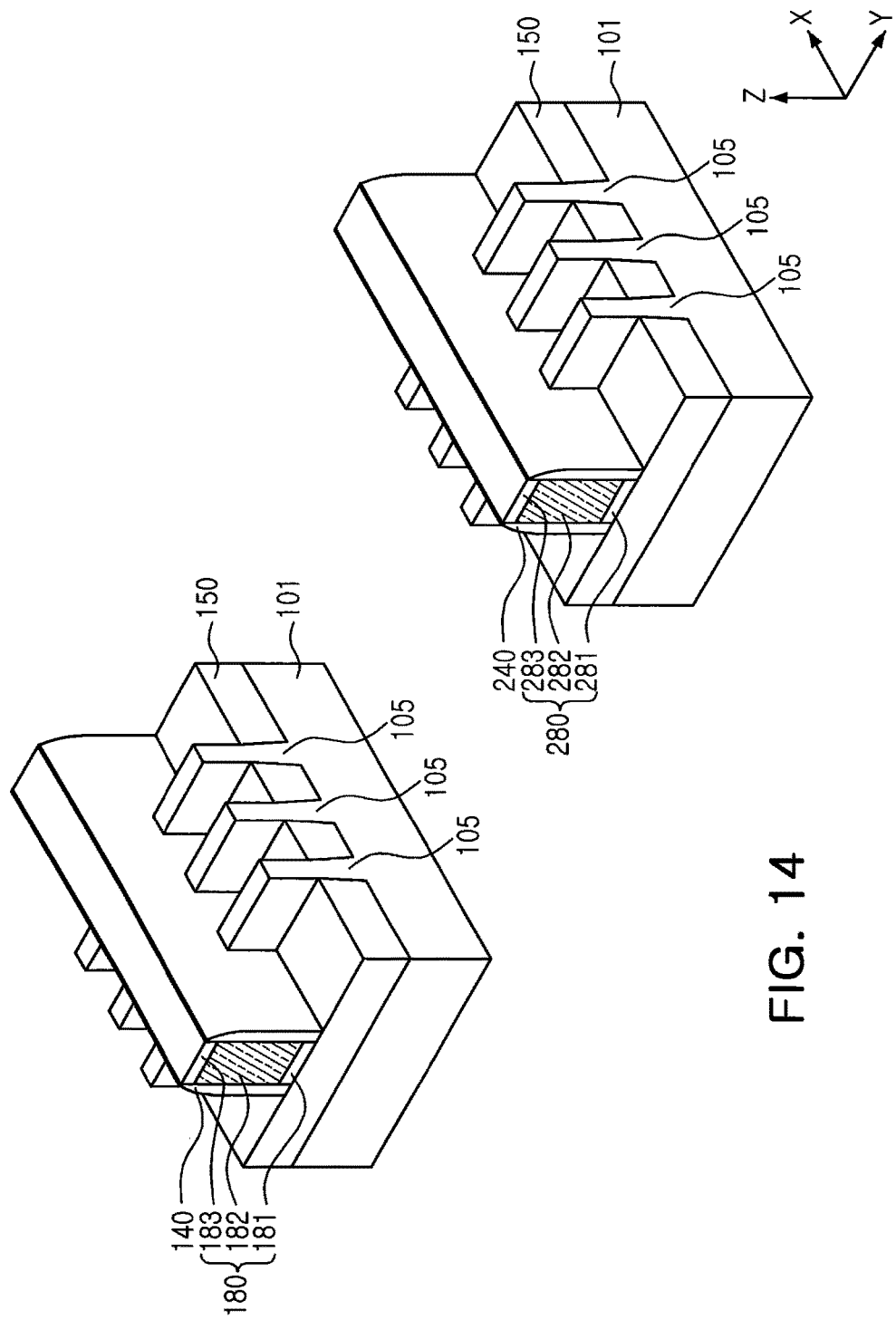

Referring to FIG. 14, first and second dummy gate structures 180 and 280 and first and second gate spacers 140 and 240 may be formed to intersect the plurality of fin structures 105. The first dummy gate structure 180 and the first gate spacer 140 may be formed in the NMOS region, and the second dummy gate structure 280 and the second gate spacer 240 may be formed in the PMOS region. The first and second dummy gate structures 180 and 280 may extend in a first direction (X-axis direction).

The first dummy gate structure 180 may include a first dummy gate insulating layer 181, a first dummy gate metal layer 182, and a first mask pattern layer 183. The first dummy gate insulating layer 181 and the first dummy gate metal layer 182 may be formed by an etching process using the first mask pattern layer 183. The first dummy gate insulating layer 181 may be formed of silicon oxide, and the first dummy gate metal layer 182 may be formed of polysilicon.

The first gate spacer 140 may be formed by forming a film of an insulating material on the first dummy gate structure 180, the plurality of fin structures 105 and the element isolation film 150, and then anisotropically etching the film. The first gate spacer 140 may include, but is not limited to, silicon oxide, silicon nitride, and/or silicon oxynitride.

The second dummy gate structure 280 and the second gate spacer 240 may be respectively formed by a process similar to that of the first dummy gate structure 180 and the first gate spacer 140. Similar to the first dummy gate structure 180, the second dummy gate structure 280 may include a second dummy gate insulating layer 281, a second dummy gate metal layer 282, and a second mask pattern layer 283. In some embodiments, the first and second dummy gate structures 180 and 280 may be formed simultaneously with each other, and the first and second gate spacers 140 and 240 may also be formed simultaneously with each other.

Figure 15:
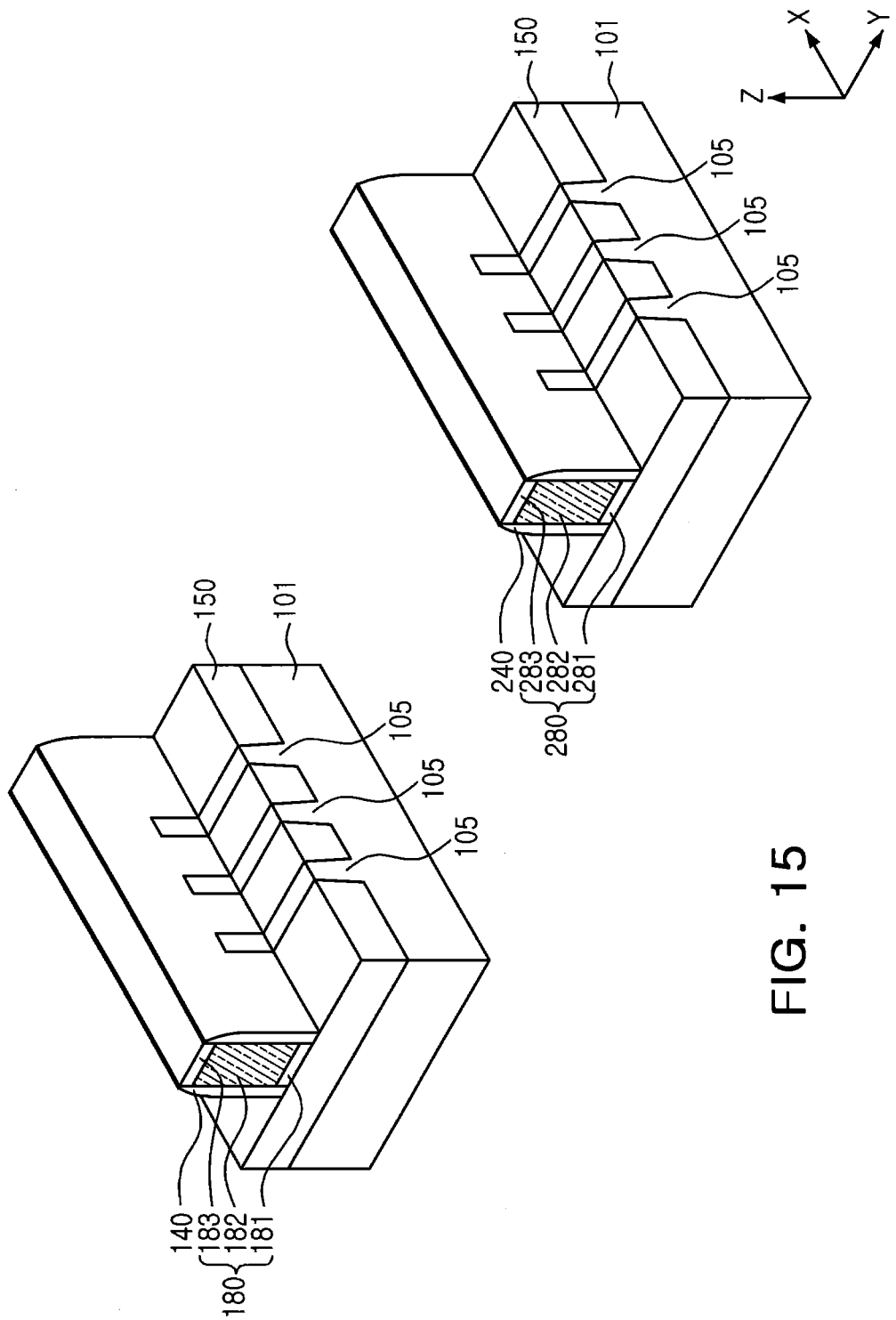

Referring to FIG. 15, the plurality of fin structures 105 on two sides of the first and second gate spacers 140 and 240, respectively, may be selectively recessed. Recesses may be formed by removing portions of the fin structures 105 from two sides of the first and second gate spacers 140 and 240, respectively. The recesses may be formed by etching the fin structures 105, by forming a separate mask layer or by using the first and second mask pattern layers 183 and 283 and the first and second gate spacers 140 and 240 as masks. In some embodiments, the recesses may be formed by sequentially performing a dry etching process and a wet etching process.

Selectively, after the recesses are formed, a separate process of curing surfaces of the recessed fin structures 105 may also be performed. The example embodiment of FIG. 15 illustrates that upper surfaces of the recessed fin structures 105 form a surface coplanar with an upper surface of the element isolation film 150, but the present inventive concepts are not limited thereto. In some embodiments, the upper surfaces of the recessed fin structures 105 may be higher or lower than an upper surface of the element isolation film 150.

Figure 16:
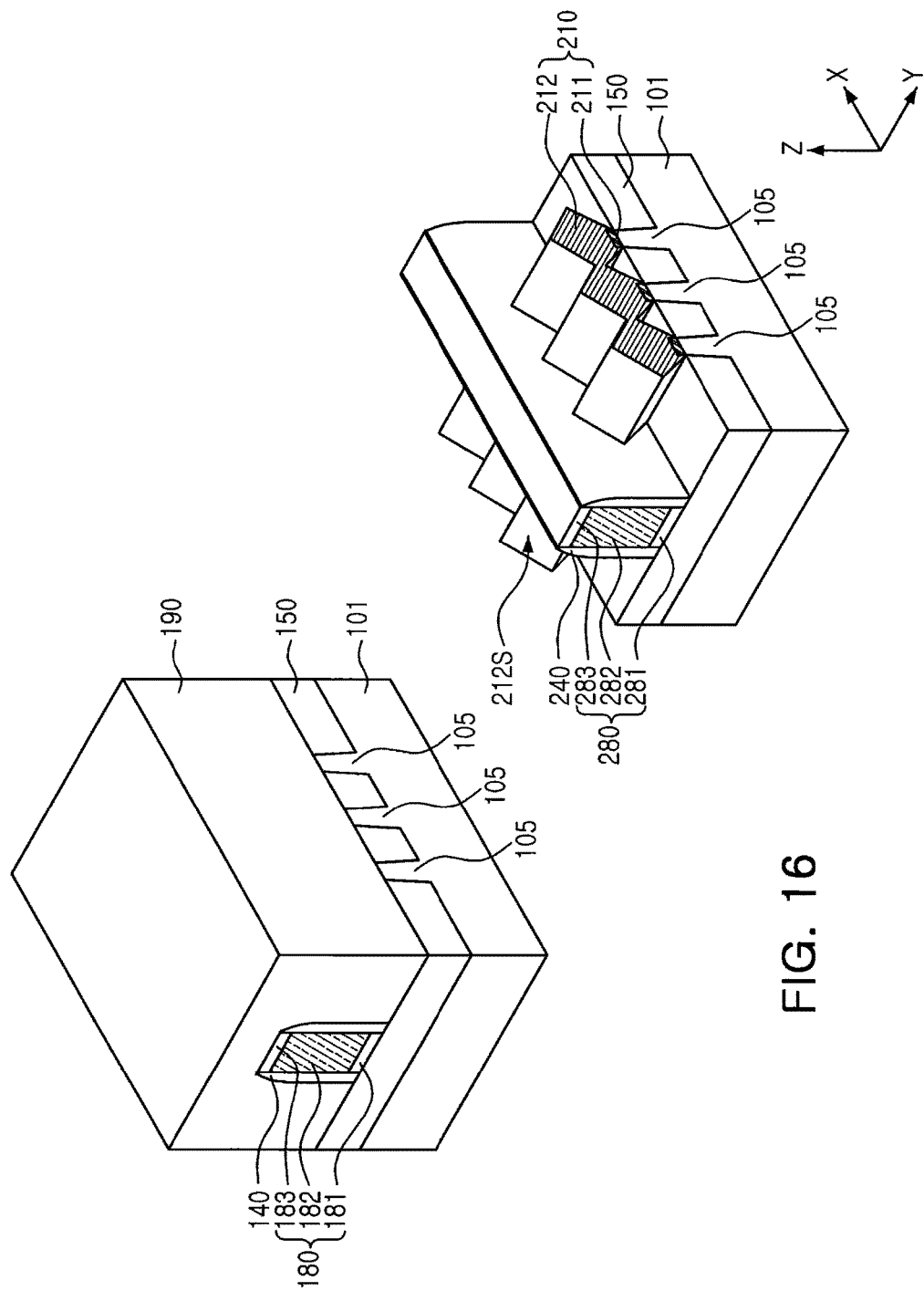

With reference to FIG. 16, a first capping layer 190 may be formed on the first dummy gate structure 180, the first gate spacer 140, and the fin structures 105 included in the NMOS region, and second active regions 210 may be formed using the fin structures 105 included in the PMOS region. The first capping layer 190 may include an insulating material, and may be formed of silicon oxide and/or silicon nitride in some embodiments, though the present inventive concepts are not limited thereto. The second active regions 210 may be formed by applying a selective epitaxial growth (SEG) process to the fin structures 105 included in the PMOS region.

The second active regions 210 formed in the PMOS region may include silicon-germanium (SiGe). For example, when silicon-germanium (SiGe) is grown on the fin structures 105 formed of silicon (Si), compressive stresses may occur. In this case, first regions 211 may first be formed as buffer layers to prevent or reduce the occurrence of defects due to a difference in lattice constants between the second active regions 210 and the fin structures 105. The first regions 211 may have a relatively low germanium concentration in the second active regions 210.

Second regions 212 may be formed on the first regions 211, and the second regions 212 may be connected to each other to provide one second active region 210. The second regions 212 may have a germanium concentration different from that of the first regions 211, and in some embodiments, the germanium concentration of the second regions 212 may be higher than a germanium concentration of the first regions 211.

The second regions 212 may grow along a crystallographically stable plane in a growth process, to have a pentagonal or hexagonal shape, as illustrated in FIG. 16. However, the present inventive concepts are not limited thereto. In some embodiments, a surface 212S of the second regions 212 may have an inclined angle with respect to the semiconductor substrate 101. For example, when the surface 212S is grown to have a crystallographically stable surface, the growth thereof may not continue, after growth of a certain amount.

In some embodiments, for example, when the second active regions 210 are formed in the PMOS region, the p-type impurity may be doped in-situ or doped using a separate ion implantation process. A p-type impurity doped in the second active regions 210 may be boron (B), indium (In), gallium (Ga), and/or boron trifluoride ($BF_3$), though the present inventive concepts are not limited thereto.

Subsequently, with reference to FIG. 17, after the fin structures 105 are exposed in the NMOS region by removing the first capping layer 190, a second capping layer 290 may be formed in the PMOS region to cover the second dummy gate structure 280 and the second active regions 210. The second capping layer 290 may include an insulating material, such as, but not limited to, silicon oxide and/or silicon nitride, in a manner similar to the first capping layer 190.

Figure 17:
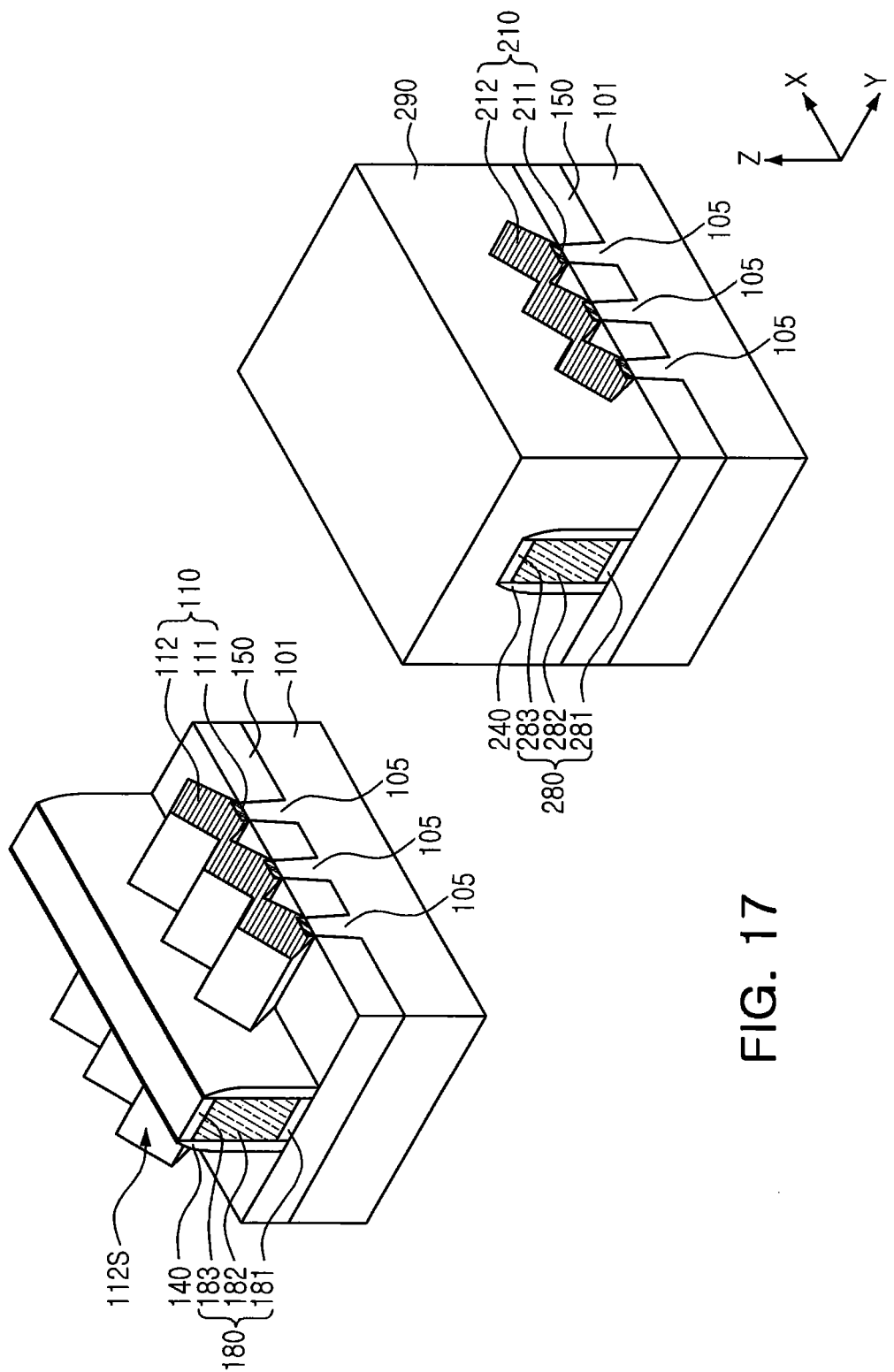

Referring to FIG. 17, the first active regions 110 may be formed using the fin structures 105 included in the NMOS region. The first active regions 110 may be formed by a selective epitaxial growth (SEG) process in a manner similar to the second active regions 210.

The first active regions 110 formed in the NMOS region may include silicon (Si). The first active regions 110 may include first regions 111 and a second region 112 in a manner similar to that of the second active regions 210. The second regions 112 may grow along a crystallographically stable plane in a growth process to have a pentagonal or hexagonal shape, as illustrated in FIG. 17, though the present inventive concepts are not limited thereto. In some embodiments, a surface 112S of the second regions 112 may have an inclined angle with respect to the semiconductor substrate 101.

In some embodiments, for example, when the first active regions 110 are formed in the NMOS region, an n-type impurity may be doped in-situ or doped using a separate ion implantation process. The N-type impurity doped in the first active regions 110 may be, but is not limited to, phosphorus (P), nitrogen (N), arsenic (As), and/or antimony (Sb).

Figure 18:
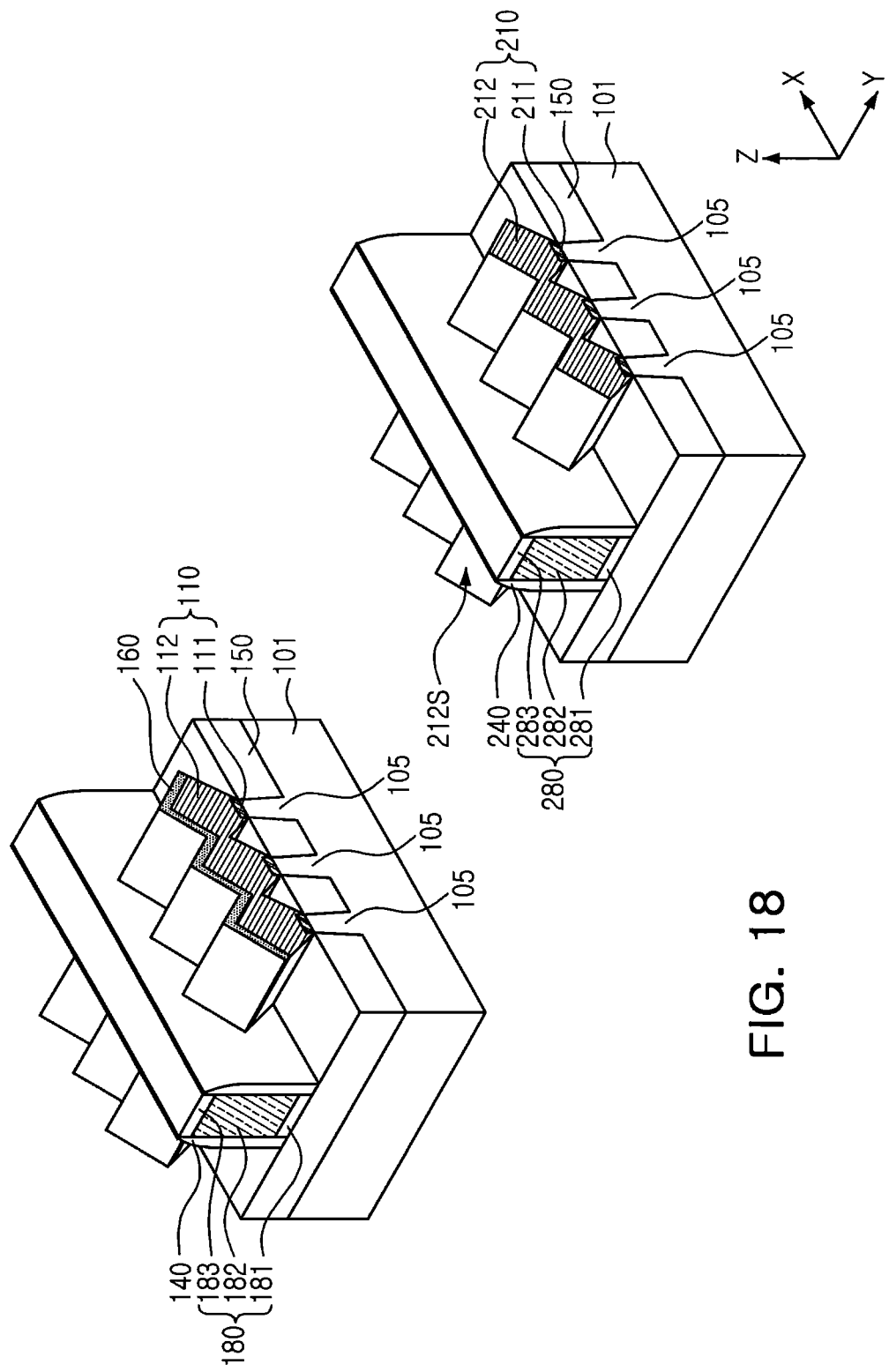

Referring to FIG. 18, a first silicide layer 160 may be formed on the first active regions 110 provided in the NMOS region and not on the second active regions 210 in the PMOS region. In order to form the first silicide layer 160 on the first active regions 110 and not on the second active regions 210, the first silicide layer 160 may be formed first, prior to removing the second capping layer 290.

A metal may be deposited on at least a portion of the surface of the first active regions 110 to form the first silicide layer 160 before the second capping layer 290 is removed. The metal deposited on the surface of the first active regions 110 may include, but is not limited to, titanium (Ti), tungsten (W), cobalt (Co), nickel (Ni), tantalum (Ta), and/or copper (Cu), and may be deposited using processes such as physical vapor deposition (PVD) or chemical vapor deposition (CVD), though the present inventive concepts are not limited thereto. For example, when the metal is deposited using the physical vapor deposition (PVD) method, the metal may be deposited on upper surfaces of the first active regions 110, as in the example embodiment illustrated in FIG. 18. In some embodiments, the metal may also be deposited on lower surfaces of the first active regions 110 and/or a portion of an upper surface of the element isolation film 150.

For example, when the metal is deposited, the first silicide layer 160 may be formed by a process such as, but not limited to, heat treatment and/or laser annealing. A composition of the first silicide layer 160 may be determined according to a metal deposited on the surface of the first active regions 110, and the first silicide layer 160 may be formed on the entirety of at least the upper surfaces of the first active regions 110. After the first silicide layer 160 is formed, the second capping layer 290 may be removed from the PMOS region, to allow the second dummy gate structure 280 and the second active regions 210 to be exposed.

As described above with reference to FIGS. 16 through 18, the first silicide layer 160 may be formed on the first active regions 110 and not on the second active regions 210. For example, if the first silicide layer 160 is formed on the second active regions 210, which are formed of silicon-germanium (SiGe) having relatively low thermal stability as compared with silicon (Si), degradation due to agglomeration may occur in the first silicide layer 160 formed on the second active regions 210, due to a relatively high-temperature thermal treatment process or the like included in a subsequent process. Thus, in some embodiments, the first silicide layer 160 may be formed only on surfaces of the first active regions 110, which are formed of silicon (Si) having relatively high thermal stability.

Figure 19:
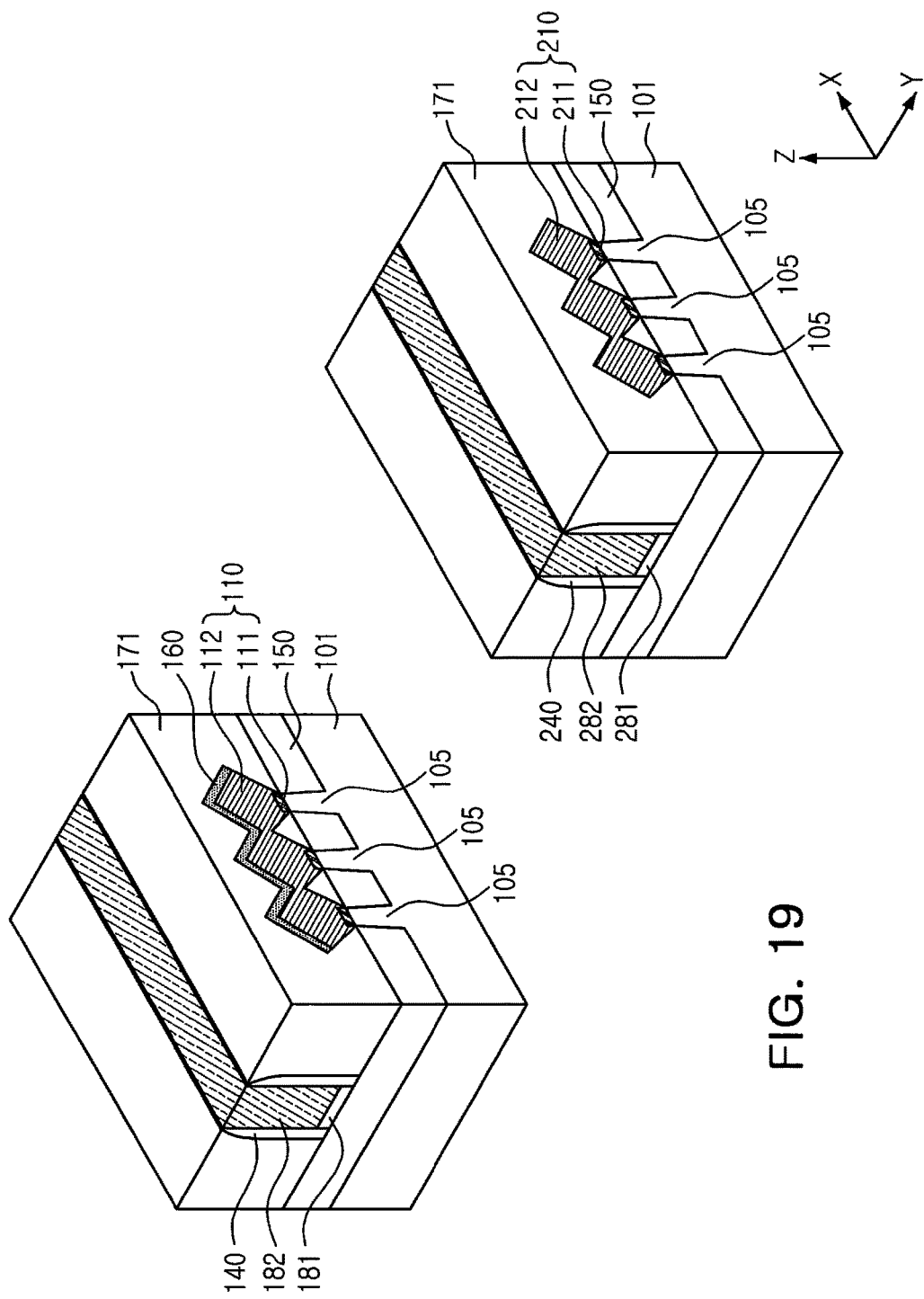

Referring to FIG. 19, a first interlayer insulating layer 171 may be formed in the NMOS region and the PMOS region. The first interlayer insulating layer 171 may be formed of an insulating material, to cover the first and second dummy gate structures 180 and 280 and the first and second active regions 110 and 210, and may then be subjected to a planarization process to allow upper surfaces of the first and second dummy gate metal layers 182 and 282 to be exposed. For example, in the process of forming the first interlayer insulating layer 171, first and second mask pattern layers 183 and 283 may be removed. The first interlayer insulating layer 171 may include at least one of silicon oxide, silicon nitride, and silicon oxynitride, though the present inventive concepts are not limited thereto.

Figure 20:
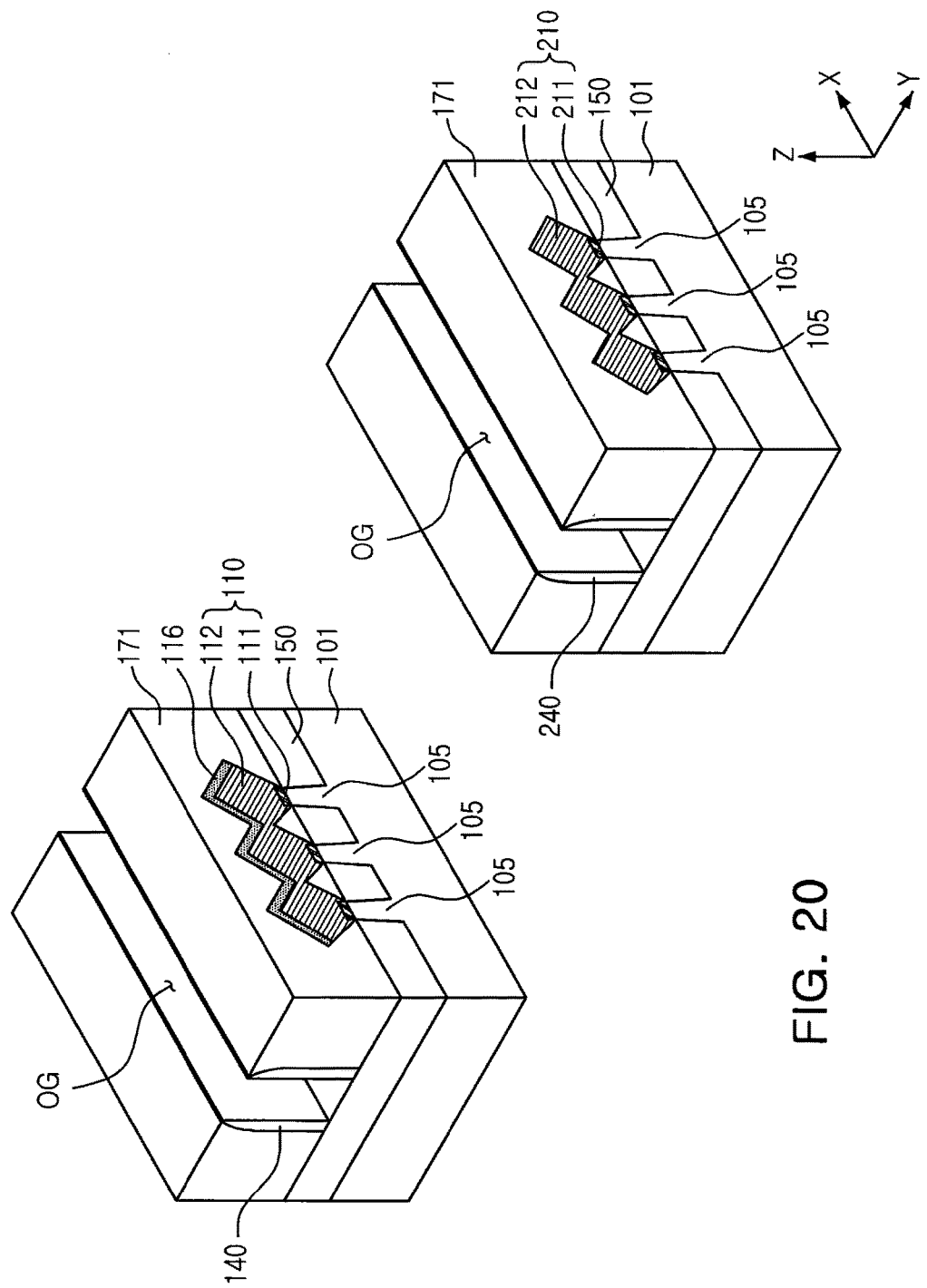

Referring to FIG. 20, the first and second dummy gate metal layers 182 and 282 and the first and second dummy gate insulating layers 181 and 281 may be removed. In the process of removing the first and second dummy gate metal layers 182 and 282 and the first and second dummy gate insulating layers 181 and 281, the first and second gate spacers 140 and 240 and the fin structures 105 may remain. Thus, a gate opening OG may be formed between the first gate spacers 140 and between the second gate spacers 240, as in the example embodiment illustrated in FIG. 20. The fin structures 105 may be exposed in the gate openings OG. According to an example embodiment, the first and second dummy gate metal layers 182 and 282 and the first and second dummy gate insulating layers 181 and 281 may be simultaneously removed.

Figure 21:
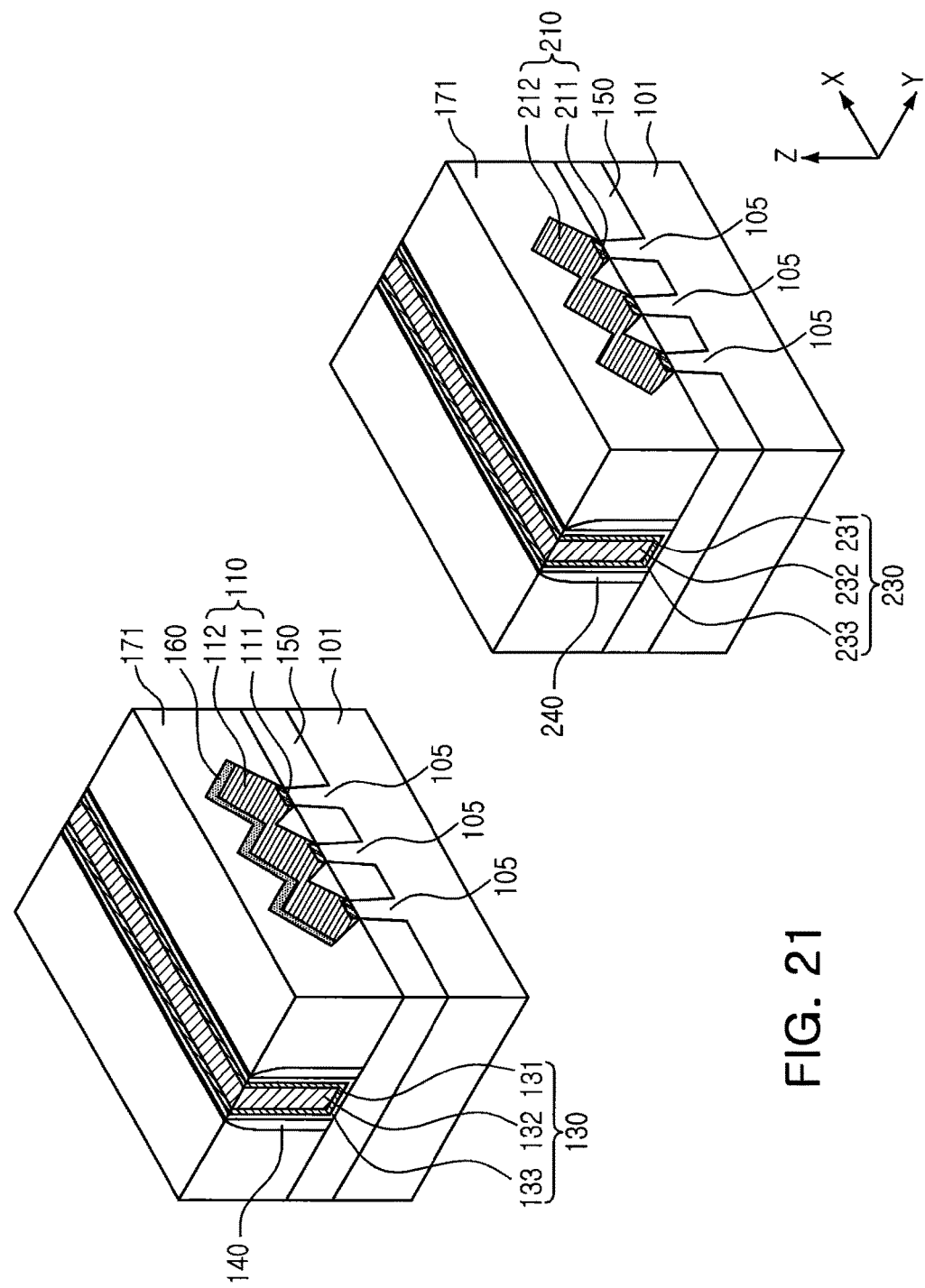

Referring to FIG. 21, first and second gate structures 130 and 230 may be formed in the gate openings OG, respectively. The first and second gate structures 130 and 230 may have the same or similar structure. Hereinafter, a description of the first gate structure 130 may be applied to the second gate structure 230 in a similar manner. In some embodiments, the first and second gate structures 130 and 230 may be formed simultaneously.

The first gate structure 130 may include a first gate insulating layer 133, a first gate metal layer 131, and a second gate metal layer 132. The first gate insulating layer 133 may be formed substantially conformally along inner sides and a bottom surface of the gate opening OG, and may include an oxide, nitride, and/or high-k material. Thus, the first gate insulating layer 133 may be formed on a side surface of the first gate spacer 140, an upper surface of the semiconductor substrate 101, and upper surfaces of the fin structures 105.

The first and second gate metal layers 131 and 132 may include a metal and/or a semiconductor material, and may also include different materials in some embodiments. The first gate metal layer 131 may serve as a diffusion prevention layer, and may include titanium nitride (TiN), though the present inventive concepts are not limited thereto. The second gate metal layer 132 may be formed of a metal such as, but not limited to, tungsten (W), copper (Cu), and/or molybdenum (Mo), or may be formed of polysilicon.

Figure 22:
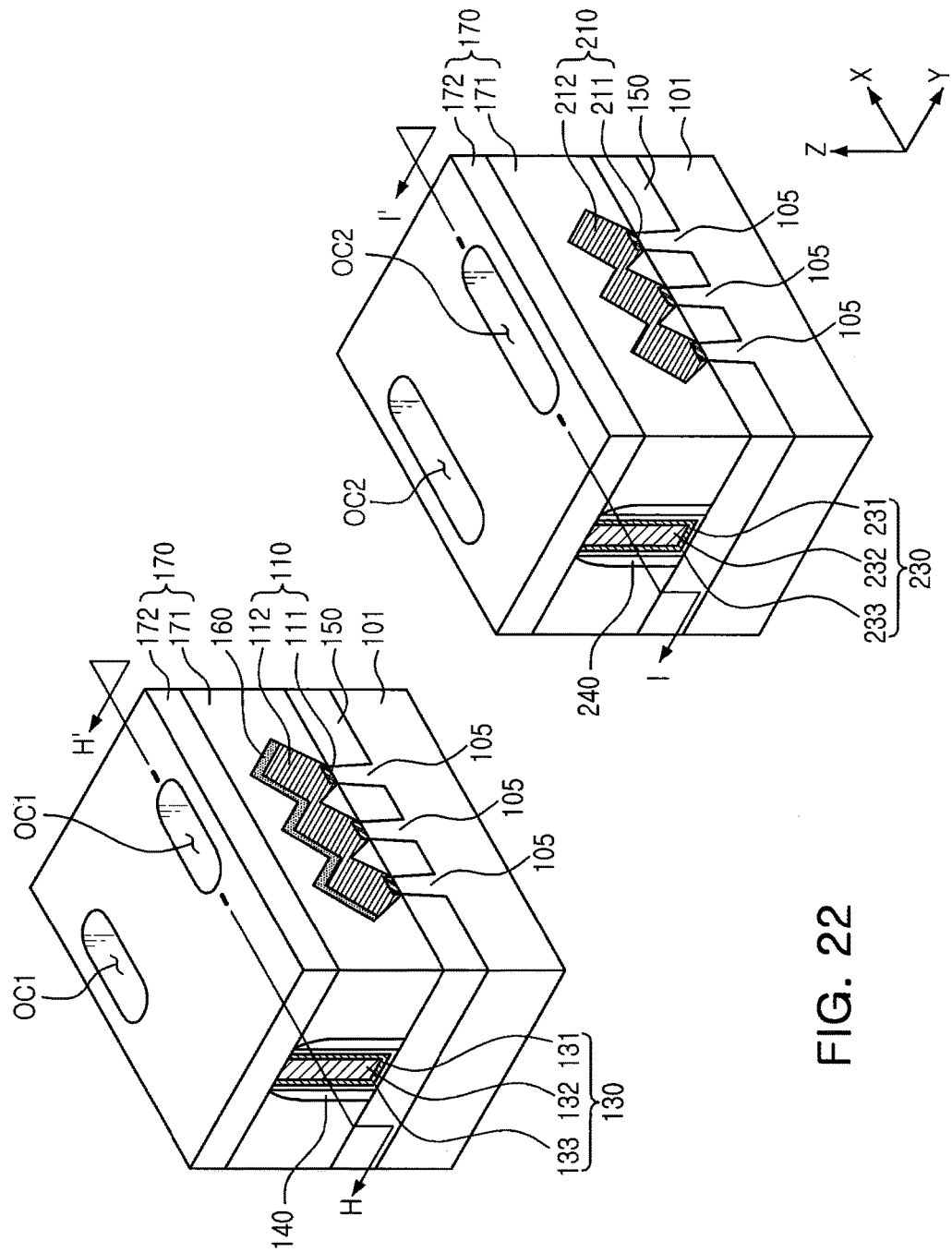

Next, referring to FIG. 22, a second interlayer insulating layer 172 may be formed on the first interlayer insulating layer 171, and first and second contact openings OC1 and OC2, penetrating through the interlayer insulating layer 170, may be formed in the NMOS region and the PMOS region, respectively. The second interlayer insulating layer 172 may include an insulating material in the same manner as the first interlayer insulating layer 171. The first and second contact openings OC1 and OC2 may be formed simultaneously, or may also be formed by different etching processes. In some embodiments, the first contact opening OC1 may first be formed by forming a mask layer to open a region corresponding to the first contact opening OC1. After forming the first contact opening OC1, the second contact opening OC2 may be formed by forming a mask layer to open a region corresponding to the second contact opening OC2. In some embodiments, the second contact opening OC2 may also be formed before the first contact opening OC1 is formed. In some embodiments, the first contact opening OC1 may have a different shape and/or size than the second contact opening OC2.

The first and second contact openings OC1 and OC2 may be formed by removing portions of the interlayer insulating layer 170 by using a separate mask layer such as a photoresist pattern. Each of the first and second contact openings OC1 and OC2 may have a first width less than a second width, and/or a first length less than a second length, of each of the first and second active regions 110 and 210, in the second direction (Y-axis direction) and in the first direction (X-axis direction), respectively. The first silicide layer 160 may be exposed in the first contact opening OC1, and the second active regions 210 may be exposed in the second contact opening OC2. In some embodiments, a portion of the second active regions 210 may be removed while the second contact opening OC2 is formed, which will be described in detail below with reference to FIG. 23.

Figure 23:
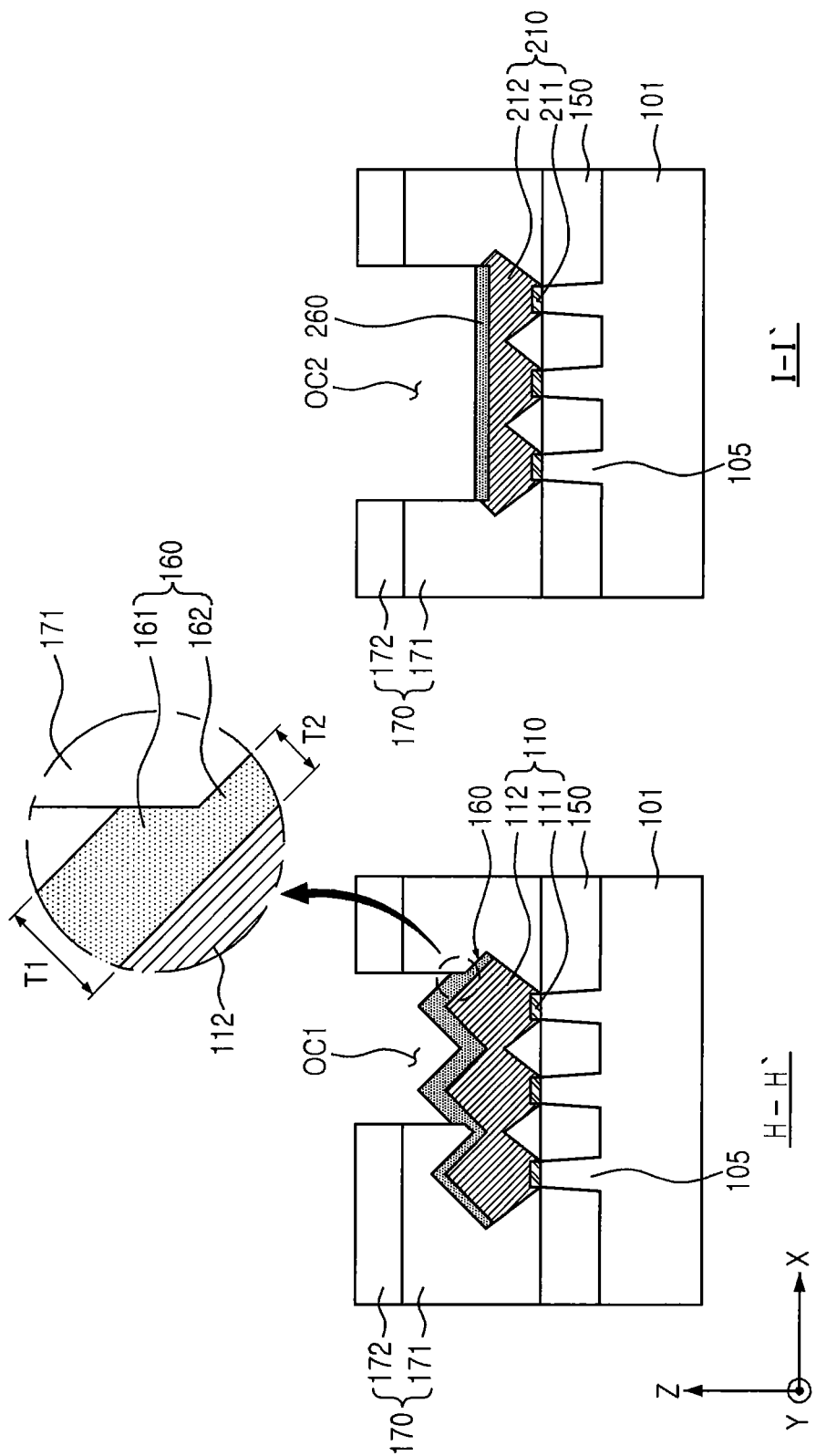

FIG. 23 illustrates cross sections taken along lines H-H' and I-I' of FIG. 22. Referring to FIG. 23, a portion of the second active regions 210 may be removed during the process of forming the second contact opening OC2. For example, portions of the second active regions 210 may be removed to form trenches.

At least portions of the second active regions 210 may be removed together with the interlayer insulating layer 170 in the process of forming the second contact openings OC2. Thus, according to an example embodiment, the second active regions 210 exposed in the second contact opening OC2 may have, for example, a relatively flat, relatively less-curved upper surface, as compared to that of the first active regions 110. In some embodiments, in the process of forming the first contact opening OC1, the first active regions 110 may be protected by a lower region 162 of the first silicide layer 160, formed before forming the interlayer insulating layer 170. In the process of forming the first contact opening OC1, only the interlayer insulating layer 170 may be selectively etched, while the etching of the first active regions 110 is significantly reduced. Thus, as illustrated in FIG. 23, the first active regions 110, exposed in the first contact openings OC1, may have an upper surface less flat or more curved than an upper surface of the second active regions 210.

For example, the first and second contact openings OC1 and OC2 may be formed, a metal may be deposited in the first and second contact openings OC1 and OC2, and a process, such as a heat treatment, a laser annealing process, or the like, may be performed thereon, thereby forming the second silicide layer 260. The second silicide layer 260 may have the same composition as that of the first silicide layer 160, based on a deposition material.

For example, when the first contact opening OC1 is in an open state, as it is in the process of forming the second silicide layer 260, a silicide layer may further be formed on the first silicide layer 160. In this case, a thickness of the first silicide layer 160 may be increased in a region thereof exposed to the first contact opening OC1.

Referring to a portion of the first silicide layer 160, illustrated in FIG. 23, the first silicide layer 160 may include an upper region 161 and a lower region 162. The upper region 161 may be a region exposed to the first contact opening OC1, and may include a silicidized region that is further formed in the process of forming the second silicide layer 260. The lower region 162 may include a region formed before the first interlayer insulating layer 171 is formed, as a region not exposed to the first contact opening OC1. As a result, since the upper region 161 is formed through a silicide process performed twice, a thickness T1 of the upper region 161 may be greater than a thickness T2 of the lower region 162. As illustrated in FIG. 23, a first width of the first contact opening OC1 may be greater than a second width of the second contact opening OC2.

Figure 24:
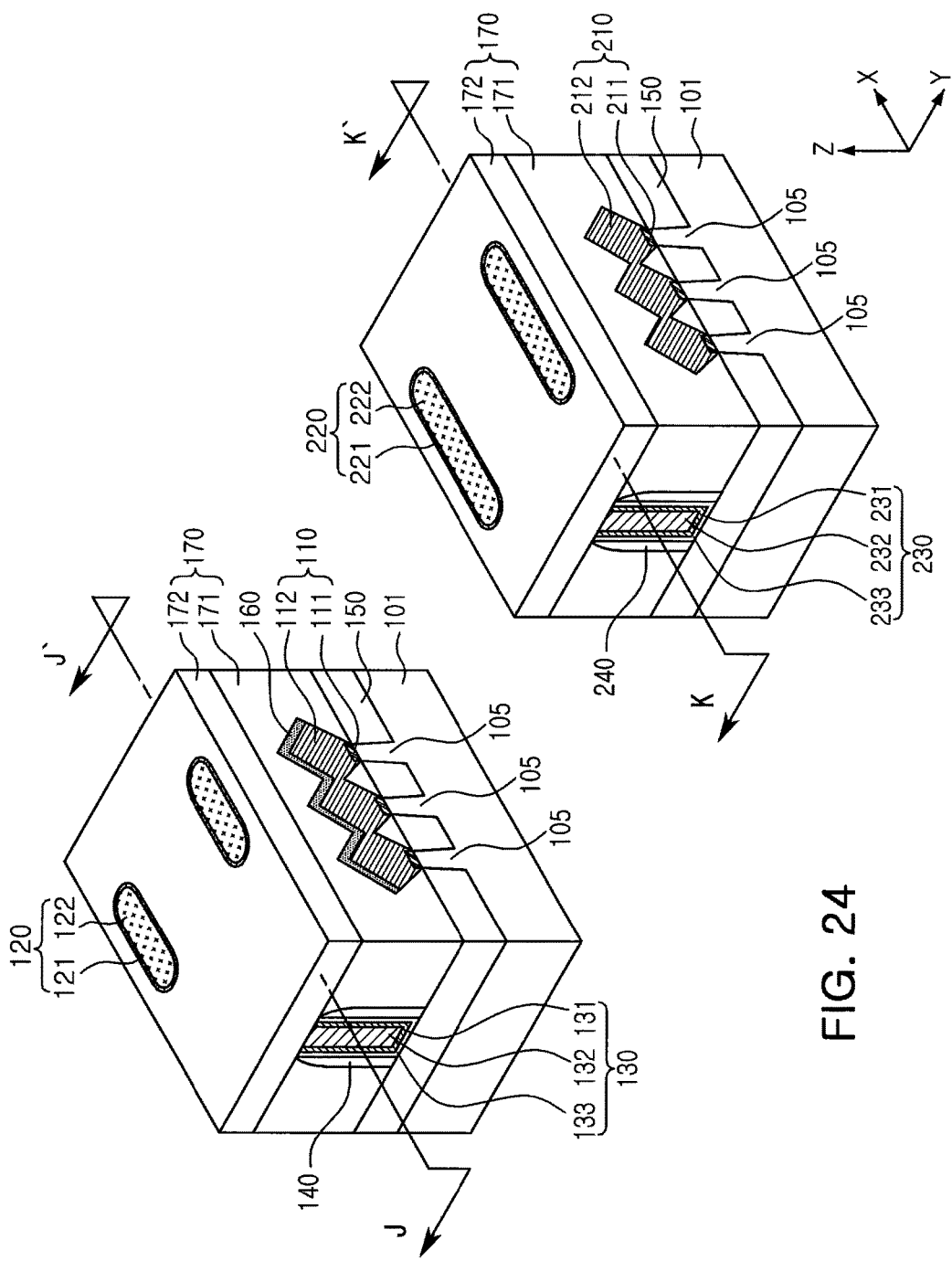
Figure 25:
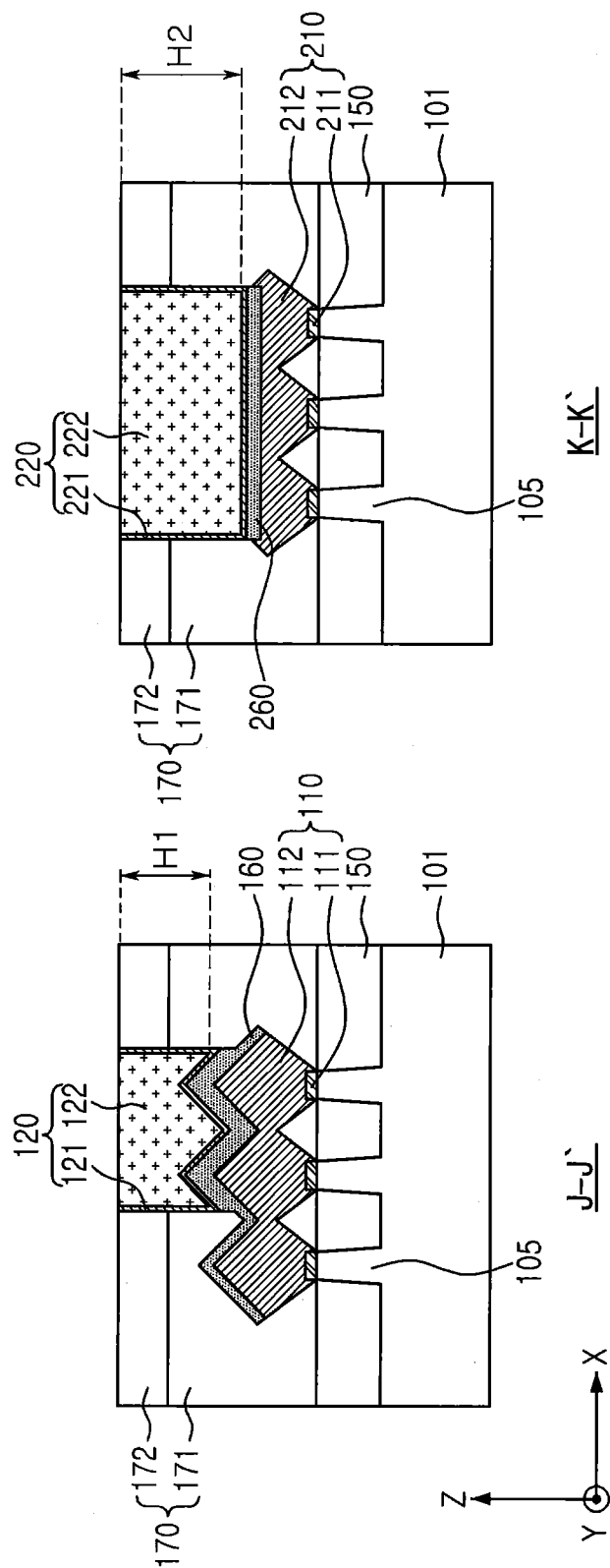

Referring to FIG. 24, the first and second contacts 120 and 220 may be formed by filling the first and second contact openings OC1 and OC2 with a conductive material. The first and second contacts 120 and 220 may have a structure similar to each other, and may be formed together with each other in a single process, which will be described below with reference to FIG. 25, illustrating cross sections taken along lines J-J' and K-K' of FIG. 24.

Each of the first contacts 120 may include a first metal layer 121 and a second metal layer 122. The first metal layer 121 may serve as a diffusion prevention layer, capable of suppressing diffusion of the metal included in the second metal layer 122, and may be formed on sides of the first contact opening OC1 and an upper surface of the first silicide layer 160. The first metal layer 121 may be formed by a process such as, but not limited to, atomic layer deposition (ALD) and/or CVD, and may include titanium nitride (TiN), tantalum nitride (TaN), and/or tungsten nitride (WN), though the present inventive concepts are not limited thereto. The second metal layer 122 may be formed of aluminum (Al), copper (Cu), tungsten (W), and/or molybdenum (Mo), though the present inventive concepts are not limited thereto.

As described above with reference to FIGS. 22 and 23, when the first and second contact openings OC1 and OC2 are formed by removing portions of the interlayer insulating layer 170, a portion of the second active regions 210 may also be removed, together with the interlayer insulating layer 170, to form trenches. Thus, at least portions of the second contacts 220 may be disposed within the trenches. In addition, a height H2 of each of the second contacts 220 may be greater than a height H1 of each of the first contacts 120.

The first and second contacts 120 and 220 may extend in the first direction (X-axis direction), and the first contacts 120 may have a length shorter than a length of each of the second contacts 220. Referring to FIG. 25, a first length of each of the first contacts 120 may be less than a second length of each of the second contacts 220 in the first direction (X-axis direction). Since the first contacts 120 may be connected to the first active regions 110 through the first silicide layer 160, which is formed on the upper surfaces or the upper and lower surfaces of the first active regions 110, even when the first contacts 120 have a relatively short length, excellent resistance characteristics may be obtained. In addition, as a length of each of the first contacts 120 may be shorter than a length of each of the second contacts 220 in the first direction (X-axis direction), parasitic capacitance between the first contacts 120 and the first gate structure 130 may be reduced.

Figure 26:
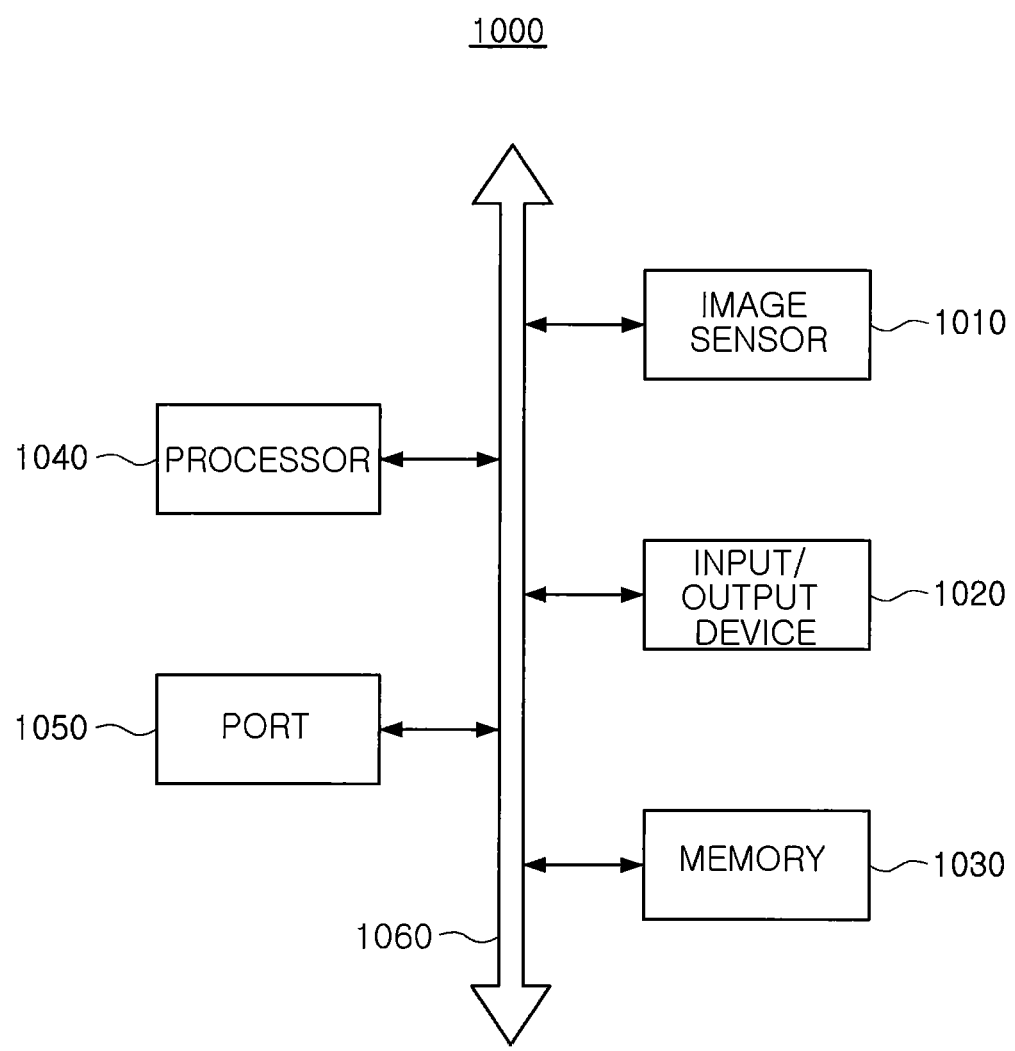
FIG. 26 is a block diagram of an electronic apparatus including a semiconductor device according to example embodiments of the present inventive concepts.

FIG. 26 is a block diagram of an electronic apparatus including a semiconductor device according to example embodiments of the present inventive concepts.

Referring to FIG. 26, a semiconductor device 10, according to an example embodiment, may be included in a computer apparatus 1000. The computer apparatus 1000, according to the example embodiment illustrated in FIG. 26, may include, for example, an image sensor 1010, an input/output device 1020, a memory 1030, a processor 1040, and/or a port 1050. The semiconductor device 10, according to the example embodiment, may be included, for example, in the image sensor 1010, the memory 1030, and/or the processor 1040. In some embodiments, the computer apparatus 1000 may further include a wired/wireless communications device, and/or a power supply device.

Among the components illustrated in FIG. 26, the port 1050 may be a device provided to allow the computer apparatus 1000 to communicate with elements such as, for example, a video card, a sound card, a memory card, and/or a USB device. The computer apparatus 1000 may be used on devices such as, but not limited to, a smart phone, a tablet PC, and/or and a smart wearable device, as well as on a general desktop computer and/or a laptop computer.

The processor 1040 may perform specific operations, commands, and/or tasks. The processor 1040 may be a central processing unit (CPU) or a microprocessor unit (MCU) and may communicate with the memory device 1030, the input/output device 1020, the image sensor 1010, and/or other devices connected to the port 1050, via a bus 1060.

The memory 1030 may be a storage medium storing data used in operation of the computer apparatus 1000. The memory 1030 may include a volatile memory, such as a random access memory (RAM), or a non-volatile memory, such as a flash memory and the like. In addition, the memory 1030 may include at least one of a solid state drive (SSD), a hard disk drive (HDD), and an optical drive (ODD), as a storage device. The input/output device 1020 may include an input device such as a keyboard, a mouse, a touch screen, and the like, and an output device such as a display, an audio output, and the like.

The image sensor 1010 may include a sensor circuit having a plurality of transistors, and the sensor circuit may be implemented, in some embodiments, by the semiconductor device 10. Further, the semiconductor device 10, according to some embodiments, may be provided in circuits included in the processor 1040 and/or the memory 1030.

As set forth above, in semiconductor devices according to some embodiments of the present inventive concepts, contact and silicide layers of different sizes may be formed in an n-type metal oxide semiconductor (NMOS) transistor and a p-type metal oxide semiconductor (PMOS) transistor, respectively. Parasitic capacitance may be decreased by reducing a length of a contact connected to an active region of an NMOS transistor, and resistance may be reduced by increasing an area of a silicide layer formed on the active region of the NMOS transistor. As a result, a semiconductor device having improved electrical characteristics, which may be practically implemented, may be provided.

It will be understood that although the terms "first," "second," etc. are used herein to describe members, regions, layers, portions, sections, components, and/or elements in example embodiments of the inventive concepts, the members, regions, layers, portions, sections, components, and/or elements should not be limited by these terms. These terms are only used to distinguish one member, region, portion, section, component, or element from another member, region, portion, section, component, or element. Thus, a first member, region, portion, section, component, or element described below may also be referred to as a second member, region, portion, section, component, or element without departing from the scope of the inventive concepts. For example, a first element may also be referred to as a second element, and similarly, a second element may also be referred to as a first element, without departing from the scope of the inventive concepts.

Spatially relative terms, such as "beneath," "below," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by those of ordinary skill in the art to which the inventive concepts pertain. It will also be understood that terms, such as those defined in commonly used dictionaries, should be interpreted as having a meaning that is consistent with their meaning in the context of this specification and the relevant art and will not be interpreted in an idealized or overly formal sense unless expressly so defined herein.

When a certain example embodiment may be implemented differently, a specific process order may be performed differently from the described order. For example, two consecutively described processes may be performed substantially at the same time or performed in an order opposite to the described order.

In the accompanying drawings, variations from the illustrated shapes as a result, for example, of manufacturing techniques and/or tolerances, are to be expected. Thus, the example embodiments of the inventive concepts should not be construed as being limited to the particular shapes of regions illustrated herein but may be construed to include deviations in shapes that result, for example, from a manufacturing process. For example, an etched region illustrated as a rectangular shape may be a rounded or certain curvature shape. Thus, the regions illustrated in the figures are schematic in nature, and the shapes of the regions illustrated in the figures are intended to illustrate particular shapes of regions of devices and not intended to limit the scope of the present inventive concepts. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

While example embodiments of the present inventive concepts have been shown and described above, it will be apparent to those skilled in the art that modifications and variations could be made without departing from the scope of the present inventive concepts, as defined by the appended claims.

What is claimed is:

1. A semiconductor device comprising:
    a first semiconductor element comprising first active regions that are doped with a first conductivity-type impurity and that are on a semiconductor substrate, a first gate structure adjacent the first active regions, and a first contact connected to the first active regions;
    a second semiconductor element comprising second active regions that are doped with a second conductivity-type impurity different from the first conductivity-type impurity and that are on the semiconductor substrate, a second gate structure adjacent the second active regions, and a second contact connected to the second active regions, and having a second length greater than a first length of the first contact in a first direction parallel to an upper surface of the semiconductor substrate;
    a first silicide layer between the first active regions and the first contact; and
    a second silicide layer between the second active regions and the second contact,
    wherein a first area of the first silicide layer is greater than a second area of the second silicide layer, and
    wherein a portion of the first silicide layer is on a portion of an upper surface of the first active regions that is not between the first contact and the first active regions.

2. The semiconductor device of claim 1, wherein the first active regions and the second active regions are on a plurality of fin structures on the semiconductor substrate and include different materials.

3. The semiconductor device of claim 2, wherein the first active regions comprise silicon (Si) and an n-type impurity, and
    the second active regions comprise silicon germanium (SiGe) and a p-type impurity.

4. The semiconductor device of claim 2, wherein the plurality of fin structures extend in a second direction intersecting the first direction.

5. The semiconductor device of claim 1, wherein the first silicide layer is formed on upper surfaces and lower surfaces of the first active regions.

6. The semiconductor device of claim 1, wherein the second area of the second silicide layer is identical to a third area of a lower surface of the second contact.

7. The semiconductor device of claim 1, wherein the first contact has a first height lower than a second height of the second contact.

8. The semiconductor device of claim 1, wherein at least a portion of the second contact is in a trench comprised in the second active regions.

9. The semiconductor device of claim 1, wherein a lower surface of the second contact has a flatter shape than a lower surface of the first contact.

10. A semiconductor device comprising:
a plurality of fin structures that are on a semiconductor substrate;
first active regions that are on the plurality of fin structures and doped with a first conductivity-type impurity;
second active regions that are on the plurality of fin structures and doped with a second conductivity-type impurity having a conductivity type different from the first conductivity-type impurity;
an interlayer insulating layer on the first active regions and the second active regions;
a first silicide layer that is on surfaces of the first active regions and having at least a portion of an upper surface in contact with the interlayer insulating layer; and
a second silicide layer that is on surfaces of the second active regions and having a second area less than a first area of the first suicide layer.

11. The semiconductor device of claim 10, further comprising a first contact connected to the first active regions and a second contact connected to the second active regions, wherein the second contact has a second length greater than a first length of the first contact in a first direction parallel to an upper surface of the semiconductor substrate.

12. The semiconductor device of claim 11, wherein the first silicide layer comprises a first region between the first active regions and the first contact, and a second region different from the first region, wherein a first thickness of the first region is greater than a second thickness of the second region.

13. A semiconductor device comprising:
a semiconductor substrate;
a plurality of fin structures that extend in a first direction on the semiconductor substrate;
a first gate structure that extends in a second direction, crossing the first direction, on the plurality of fin structures;
a second gate structure that extends in the second direction on the plurality of fin structures;
a first active region of a first conductivity type that is on a fin structure of the plurality of fin structures and that is adjacent the first gate structure;
a second active region of a second conductivity type, different from the first conductivity type, that is on the fin structure of the plurality of fin structures and that is adjacent the second gate structure;
a first contact on the first active region;
silicide layer on a portion of an upper surface of the first active region that is not between the first contact and the first active region; and
a second contact on the second active region, the second contact having a second length in the second direction that is greater than a first length of the first contact in the second direction.

14. The semiconductor device of claim 13, wherein the first active region is on two or more of the plurality of fin structures.

15. The semiconductor device of claim 13, wherein a first height of the first contact in a third direction perpendicular to the semiconductor substrate is less than a second height of the second contact.

16. The semiconductor device of claim 13, wherein the silicide layer is on a lower surface of the first active region between the first active region and the semiconductor substrate.

17. The semiconductor device of claim 13, wherein a second portion of the upper surface of the first active region that is adjacent the first contact is non-planar, and wherein a second upper surface of the second active region that is adjacent the second contact is planar.

18. The semiconductor device of claim 1, wherein a first length of the first contact is different than a second length of the first silicide layer in the first direction parallel to the upper surface of the semiconductor substrate.

19. The semiconductor device of claim 11, wherein a portion of the first silicide layer is on a portion of an upper surface of the first active regions that is not between the first contact and the first active regions.

20. The semiconductor device of claim 11, wherein the first length of the first contact is different than a third length of the first suicide layer in the first direction parallel to the upper surface of the semiconductor substrate.

* * * * *